(12) United States Patent
Watson et al.

(10) Patent No.: US 6,774,981 B1
(45) Date of Patent: Aug. 10, 2004

(54) MODULAR EXPOSURE APPARATUS WITH REMOVABLE OPTICAL DEVICE AND IMPROVED ISOLATION OF THE OPTICAL DEVICE

(75) Inventors: Douglas C. Watson, Campbell, CA (US); Alton H. Phillips, Mountain View, CA (US)

(73) Assignee: Nikon Corporation (JP)

( * ) Notice: Subject to any disclaimer, the term of this patent is extended or adjusted under 35 U.S.C. 154(b) by 0 days.

(21) Appl. No.: 09/658,615

(22) Filed: Sep. 8, 2000

(51) Int. Cl.[7] .................. G03B 27/42; G03B 27/58; G03B 27/32; F16M 13/00
(52) U.S. Cl. ................... 355/53; 355/72; 355/77; 248/550
(58) Field of Search ................. 355/53, 72, 67, 355/77; 250/492.1; 248/550, 638

(56) References Cited

U.S. PATENT DOCUMENTS

| | | | |
|---|---|---|---|
| 5,150,153 A | | 9/1992 | Franken et al. |
| 5,610,686 A | * | 3/1997 | Osanai ................. 355/72 |
| 5,953,105 A | * | 9/1999 | Van Engelen et al. ........ 355/53 |
| 6,008,885 A | * | 12/1999 | Takahashi et al. ........... 355/67 |
| 6,036,162 A | * | 3/2000 | Hayashi .................... 248/550 |
| 6,069,683 A | * | 5/2000 | Iwamoto .................... 355/53 |
| 6,252,234 B1 | * | 6/2001 | Hazelton et al. ....... 250/442.11 |
| 6,522,388 B1 | * | 2/2003 | Takahashi et al. ............ 355/53 |

FOREIGN PATENT DOCUMENTS

| | | |
|---|---|---|
| EP | 1248288 A1 | 10/2002 |
| WO | WO99/26120 | 5/1999 |

OTHER PUBLICATIONS

PCT Written Opinion PCT/US01/27639, Jan. 16, 2003.
U.S. patent application Ser. No. 09/721,733, Nishi, filed Nov. 27, 2000.

* cited by examiner

Primary Examiner—Peter B. Kim
(74) Attorney, Agent, or Firm—Steven G. Roeder; Jim Rose

(57) ABSTRACT

An exposure apparatus (10) that includes a support frame (12), a base frame (14), a first stage assembly (16), a second stage assembly (18), an optical frame (20), an optical device (22), and a measurement system (24) is provided herein. The exposure apparatus (10) is typically mounted to a mounting base (30). As provided herein, the optical frame (20), the optical device (22), and a portion of the measurement system (24) can be assembled as an optical assembly (36) that is isolated from the base frame (14) with an optical isolation system (42). Further, the base frame (14), at least a portion of the first stage assembly (16) and the second stage assembly (18) can be assembled as a base assembly (38) that is isolated from the support frame (12) with a base isolation system (40). With this design, the base assembly (38) is isolated from the support frame (12) with the base isolation system (40) and the optical assembly (36) is isolated from the base assembly (38) with the optical isolation system (42). As a result thereof, the assemblies (36), (38) are effectively attached in series to the mounting base (30) with the isolation systems (40), (42) and the optical device (22) is isolated from the mounting base (30) with two levels of isolation. The two levels of isolation systems (40), (42) better isolate the optical device (22) from vibration and disturbances. Further, with the design provided herein, the optical device (22) and the other components of the optical assembly (36) can be accessed relatively easily for service and adjustment.

112 Claims, 18 Drawing Sheets

MODULAR EXPOSURE APPARATUS WITH REMOVABLE OPTICAL DEVICE AND IMPROVED ISOLATION OF THE OPTICAL DEVICE

FIELD OF THE INVENTION

The present invention is directed to exposure apparatuses. More specifically, the present invention is directed to a modular exposure apparatus and a method for making a modular exposure apparatus. Additionally, the present invention is directed to an exposure apparatus having improved isolation of the optical device.

BACKGROUND

Exposure apparatuses are commonly used to transfer images from a reticle onto a semiconductor wafer during semiconductor processing. A typical exposure apparatus includes a support frame, a measurement system, a control system, an illumination source, an optical device, a reticle stage for retaining a reticle, and a wafer stage for retaining a semiconductor wafer.

The support frame typically supports the measurement system, the illumination source, the reticle stage, the optical device, and the wafer stage above the ground. The measurement system monitors the positions of the stages relative to a reference such as the optical device. The optical device projects and/or focuses the light that passes through the reticle. The reticle stage includes one or more movers to precisely position the reticle relative to the optical device. Similarly, the wafer stage includes one or more movers to precisely position the wafer relative to the optical device.

The size of the images and features within the images transferred onto he wafer from the reticle are extremely small. Accordingly, the precise positioning of the wafer and the reticle relative to the optical device is critical to the manufacture of high density, semiconductor wafers.

Unfortunately, mechanical vibrations and deformations in the support frame of the exposure apparatus can influence the accuracy of the exposure apparatus. For example, the movers utilized to move the stages generate reaction forces that vibrate and deform the support frame of the exposure apparatus.

The vibrations and deformations in the support frame can move the stages and the optical device out of precise relative alignment. Further, the vibrations and deformations in the support frame can cause the measurement system to improperly measure the positions of the stages relative to the optical device. Additionally, vibration of the optical device can cause deformations of lens elements within the optical device and degrade the optical imaging quality. As a result thereof, the accuracy of the exposure apparatus and the quality of the integrated circuits formed on the wafer can be compromised.

One attempt to solve this problem involves the use of a support frame having a main frame and a reaction frame. The main frame is used to support most of the components of the exposure apparatus above the ground, while the reaction frame is used to transfer the reaction forces from the motors of the stages to the ground. Unfortunately, with this design, the optical device and the measurement system may still be subjected to reaction forces and disturbances that can influence the accuracy of the exposure apparatus. Moreover, with this design, the assembly and disassembly of the exposure apparatus can be time consuming and difficult.

Further, the combination of the main frame and the reaction frame limits and restricts access to many of the components of the exposure apparatus. For example, with current designs, multiple components of the exposure apparatus must be removed to access the optical device. As a result thereof, service and adjustment of the optical device is very difficult and time consuming.

In light of the above, it is an object of the present invention to provide an exposure apparatus with improved isolation of the optical device and the measurement system. Another object is to provide an exposure apparatus with improved access to the optical device. Yet another object is to provide an exposure apparatus that is relatively easy to assemble and disassemble. Still another object is to provide an exposure apparatus capable of manufacturing precision devices, such as high density, semiconductor wafers.

SUMMARY

The present invention is directed to an exposure apparatus for transferring an image onto a device, i.e. a semiconductor wafer that satisfies these needs. The exposure apparatus includes a base assembly, a base isolation system for securing the base assembly to the mounting base, an optical assembly, and an optical isolation system for securing the optical assembly to the base assembly. The base assembly includes at least a portion of a stage assembly and the optical assembly includes an optical device. The base isolation system reduces the effect of vibration of the mounting base causing vibration on the base assembly. Further, the optical isolation system reduces the effect of vibration of the base assembly causing vibration on the optical assembly.

Importantly, the base assembly is isolated from the mounting base with the base isolation system and the optical assembly is isolated from the base assembly with the optical isolation system. Hence, the assemblies are effectively attached in series to the mounting base with the isolation systems and the optical device is isolated from the mounting base with two levels of isolation systems. The two isolation systems better isolate the optical device from vibration and disturbances. This allows for more accurate positioning of the reticle and the semiconductor wafer relative to the optical device and the manufacture of higher quality and higher density semiconductor wafers.

Further, as provided herein, many of the components of the base assembly and many of the components of the optical assembly can be added to the exposure apparatus as a module. As a result of the modular design, the optical device and the other components of the optical assembly can be accessed relatively easily for service and adjustment. Additionally, the exposure apparatus can be assembled and disassembled easier. This minimizes downtime for the exposure apparatus.

As provided herein, the base isolation system can include a plurality of spaced apart base flexible supports for attenuating movement of the base assembly relative to the mounting base and a plurality of spaced apart base movers for adjusting the position of the base assembly relative to the mounting base. Similarly, the optical isolation system can include a plurality of spaced apart assembly flexible supports for attenuating movement of the optical assembly relative to the base assembly and a plurality of spaced apart assembly movers for adjusting the position of the optical assembly relative to the base assembly.

The base assembly can include a base frame that supports a portion of a first stage assembly and a second stage assembly. The base frame includes a base frame aperture that receives the optical assembly and the optical device.

The optical assembly can include an optical frame, the optical device, a portion of the measurement system, and a first stage base of the first stage assembly. The optical device is attached to the optical frame and the combination can be added to and removed from the exposure apparatus as a module. The first stage base is supported by the optical frame. The optical assembly concept provided herein allows the optical device and the optical frame to be removed as a module.

As provided herein, the exposure apparatus also includes a support frame that extends between the mounting base and the base isolation system. The support frame supports the base assembly above the mounting base.

The present invention is also directed to a method for making an exposure apparatus, a method for making a device, and a method for manufacturing a wafer.

As used herein, the terms "secured" and/or "secure" shall mean and include to fasten directly or with a low-stiffness type connection.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1:
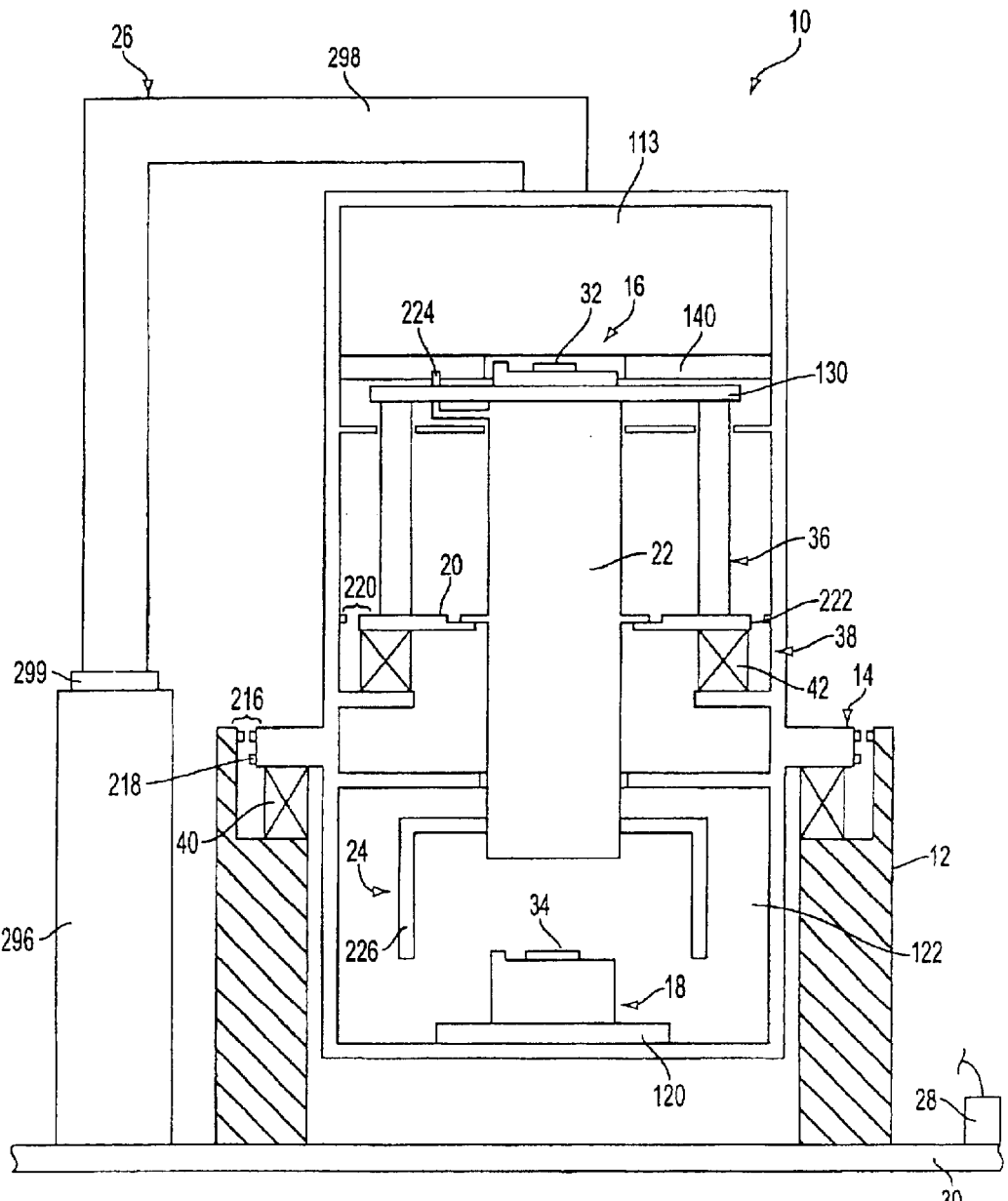
FIG. 1 is a simplified illustration of an exposure apparatus having features of the present invention.
Figure 2:
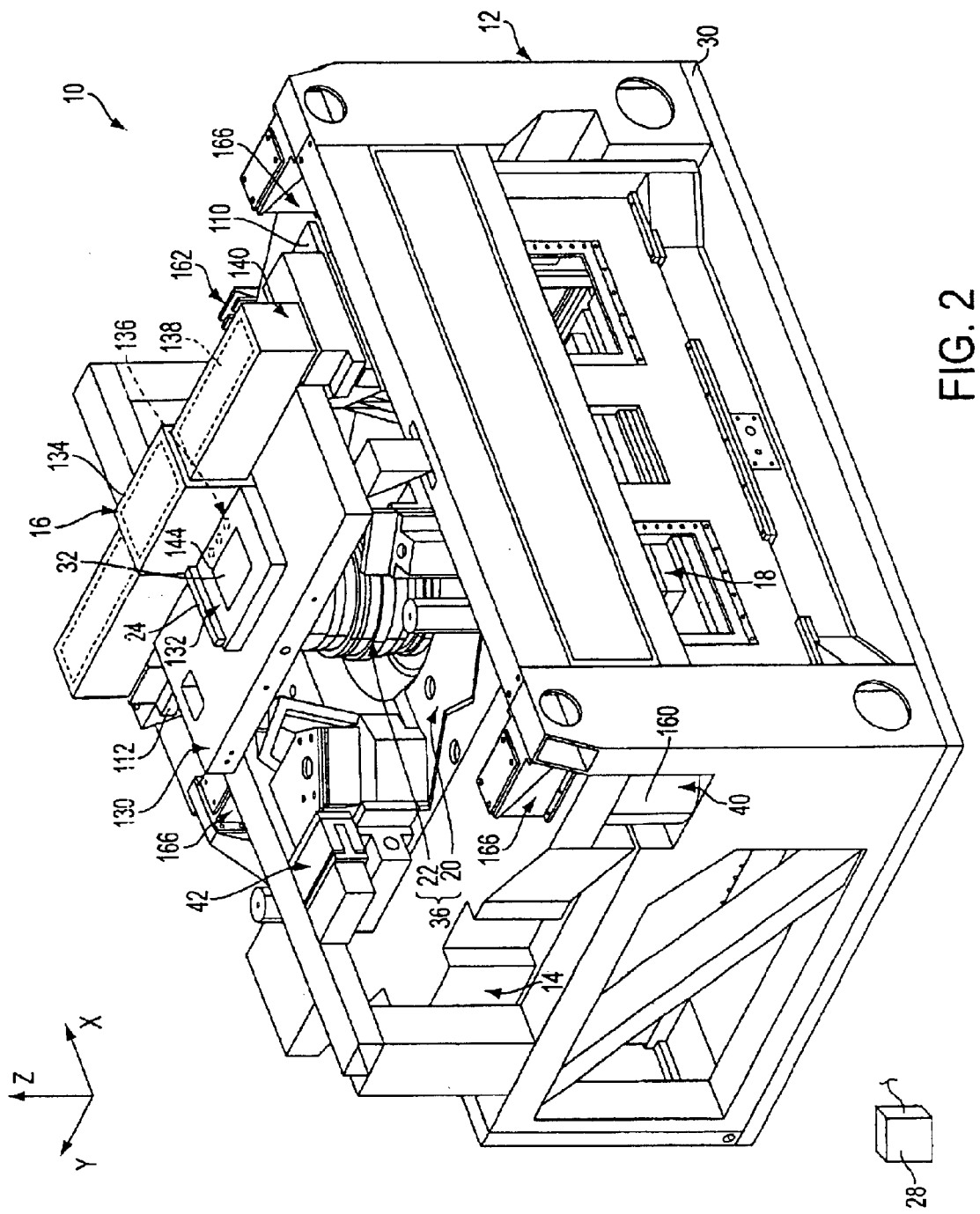
FIG. 2 is a front left perspective view of a portion of an exposure apparatus having features of the present invention.
Figure 3:
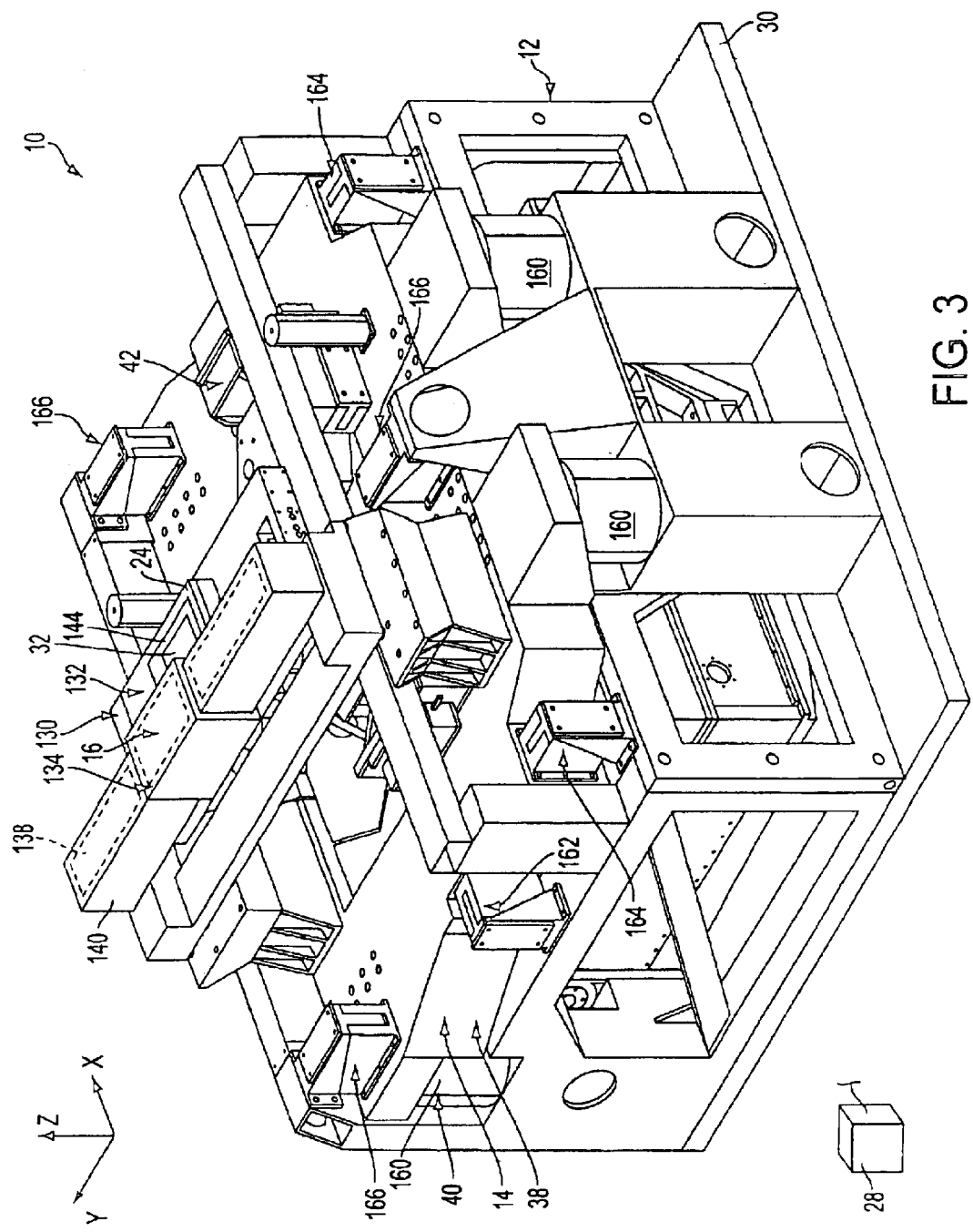
FIG. 3 is a rear right perspective view of the portion of the exposure apparatus of FIG. 2.
Figure 4:
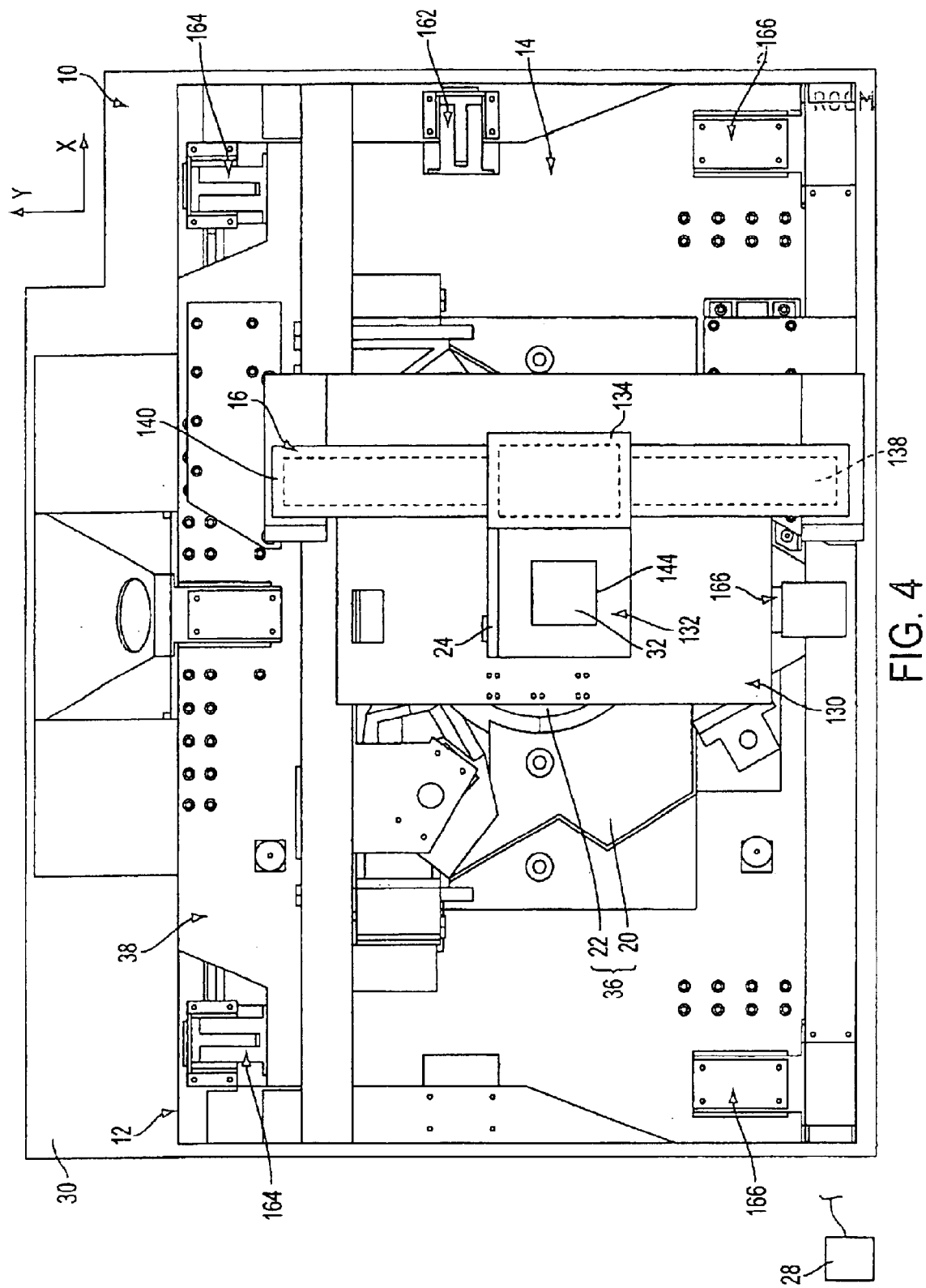
FIG. 4 is a top plan view of the portion of the exposure apparatus of FIG. 2.

FIGS. 1–4 illustrate an exposure apparatus 10 having features of the present invention. More specifically, FIG. 1 illustrates a simplified, block type diagram of an exposure apparatus 10 that outlines the major features of the present invention. Alternately, FIGS. 2 and 3 illustrate perspective views, and FIG. 4 illustrates a top plan view of how some of the features of the exposure apparatus 10 of FIG. 1 can be actually implemented. As provided herein, the exposure apparatus 10 includes a support frame 12, a base frame 14, a first stage assembly 16, a second stage assembly 18, an optical frame 20, an optical device 22, a measurement system 24, an illumination system 26 (irradiation apparatus) (only illustrated in FIG. 1), and a control system 28. The exposure apparatus 10 is typically mounted to a mounting base 30. The mounting base 30 can be the ground, a base, or floor or some other supporting structure.

The exposure apparatus 10 is particularly useful as a lithographic device that transfers a pattern (not shown) of an integrated circuit from a reticle 32 onto a device 34 (illustrated in FIG. 1) such as a semiconductor wafer. Alternately, as discussed below, the exposure apparatus 10 can be used in the manufacture and/or inspection of other types of devices 34.

Preferably, as provided herein, the optical frame 20 and the optical device 22 are assembled as an optical assembly 36 that is isolated from the base frame 14. Further, the base frame 14, at least a portion of the first stage assembly 16 and the second stage assembly 18 are assembled as a base assembly 38 that is isolated from the support frame 12. More specifically, as provided in detail below, a base isolation system 40 is used to secure the base assembly 38 to the support frame 12 and an optical isolation system 42 is used to secure the optical assembly 36 to the base assembly 38. Stated another way, the base assembly 38 is isolated from the support frame 12 with the base isolation system 40 and the optical assembly 36 is isolated from the base assembly 38 with the optical isolation system 42. As a result thereof, the assemblies 36, 38 are effectively attached in series to the mounting base 30 with the isolation systems 40, 42. Further, the optical device 22 is isolated from the mounting base 30 with two levels of isolation.

With the design provided herein, the optical device 22 and the other components of the optical assembly 36 can be accessed relatively easily for service and adjustment. This minimizes downtime for the exposure apparatus 10. Further, the two levels of isolation systems 40, 42 better isolate the optical device 22 from vibration and disturbances. This minimizes distortion of the optical device 22 and allows for more accurate positioning of the reticle 32 and the device 34 relative to the optical device 22 and the manufacture of higher quality, higher density wafers.

Some of the Figures provided herein include a coordinate system that designates an X axis, a Y axis, and a Z axis. It should be understood that the coordinate system is merely for reference and can be varied. For example, the X axis can be switched with the Y axis and/or the exposure apparatus 10 can be rotated.

The support frame 12 secures the base isolation system 40 and the base assembly 38 to the mounting base 30. In the embodiment illustrated in the Figures, the support frame 12 is also used to transfer the reaction forces from the optical isolation system 42 to the mounting base 30.

Figure 5:
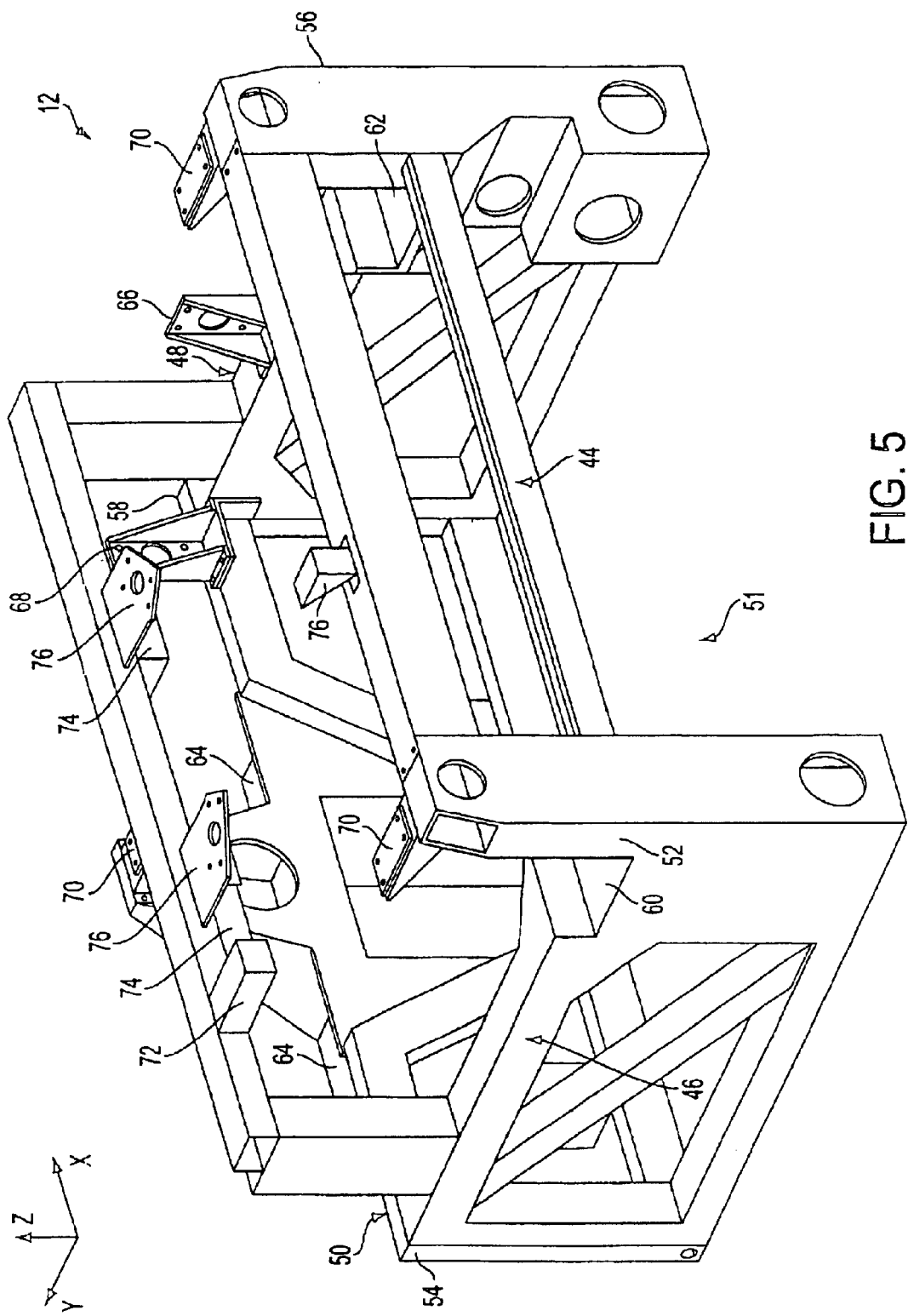
FIG. 5 is a front left perspective view of a support frame having features of the present invention.
Figure 6:
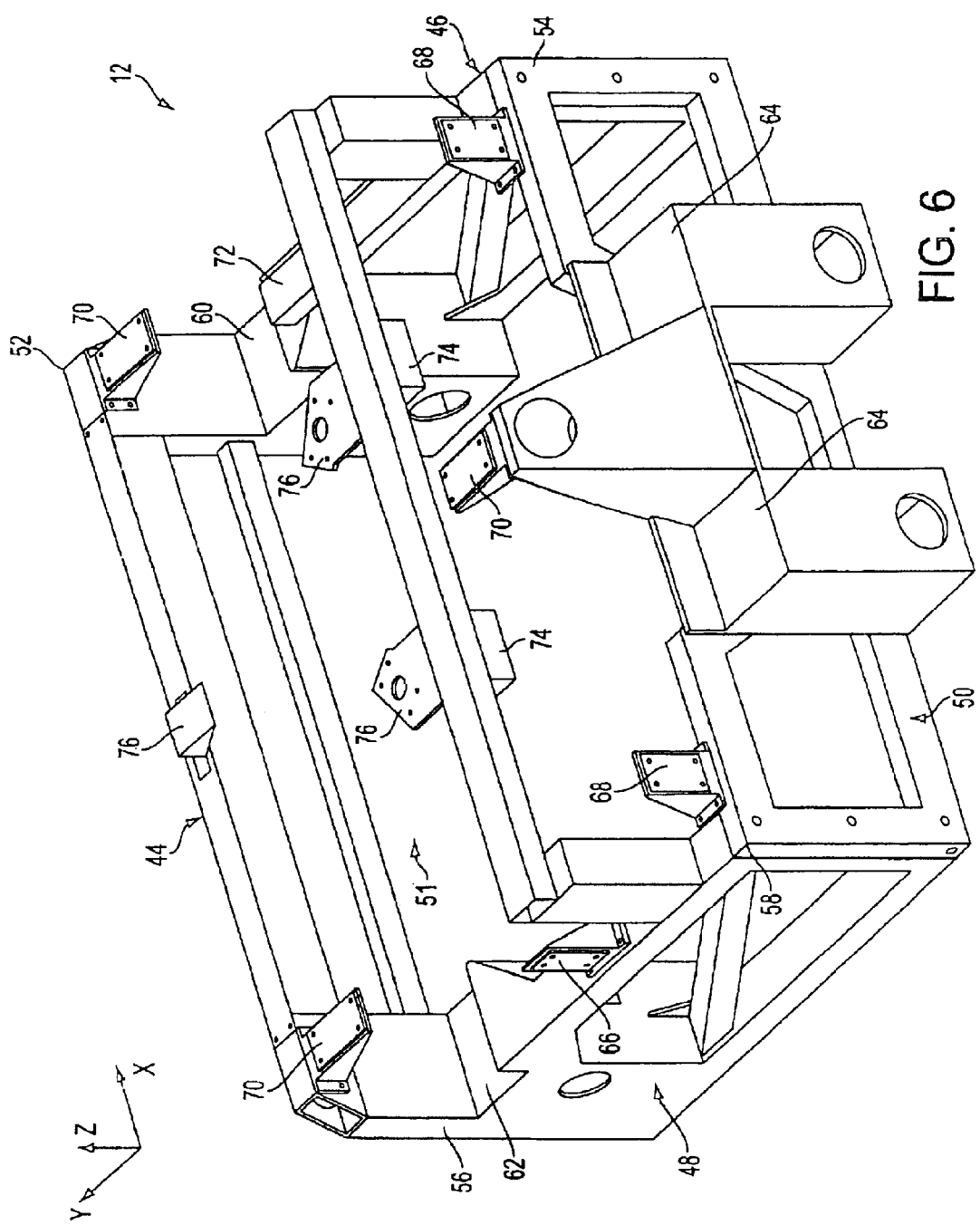
FIG. 6 is a rear right perspective view of the support frame of FIG. 5.
Figure 7:
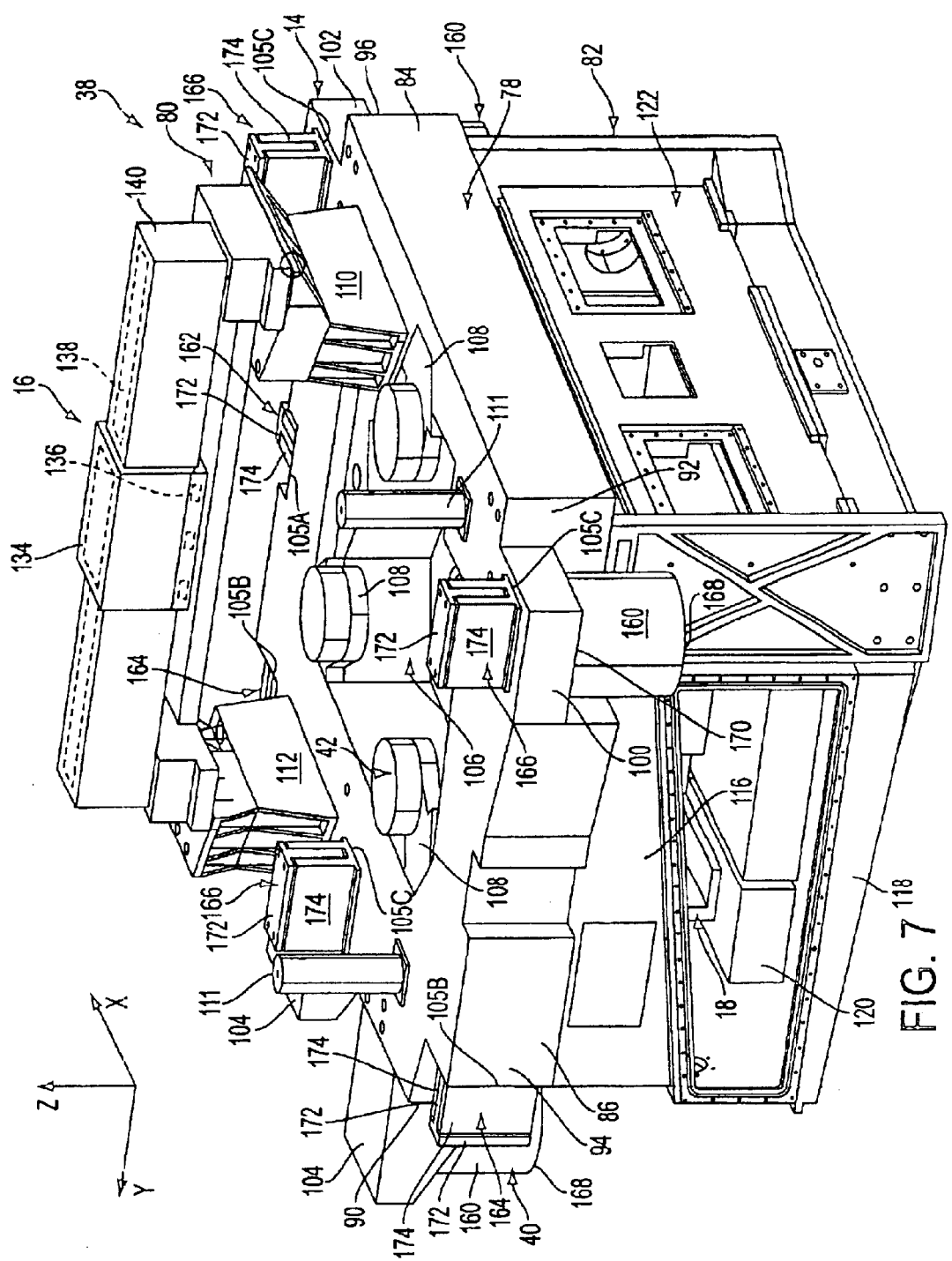
FIG. 7 is a front left perspective view of a base assembly and a base isolation system having features of the present invention.
Figure 8:
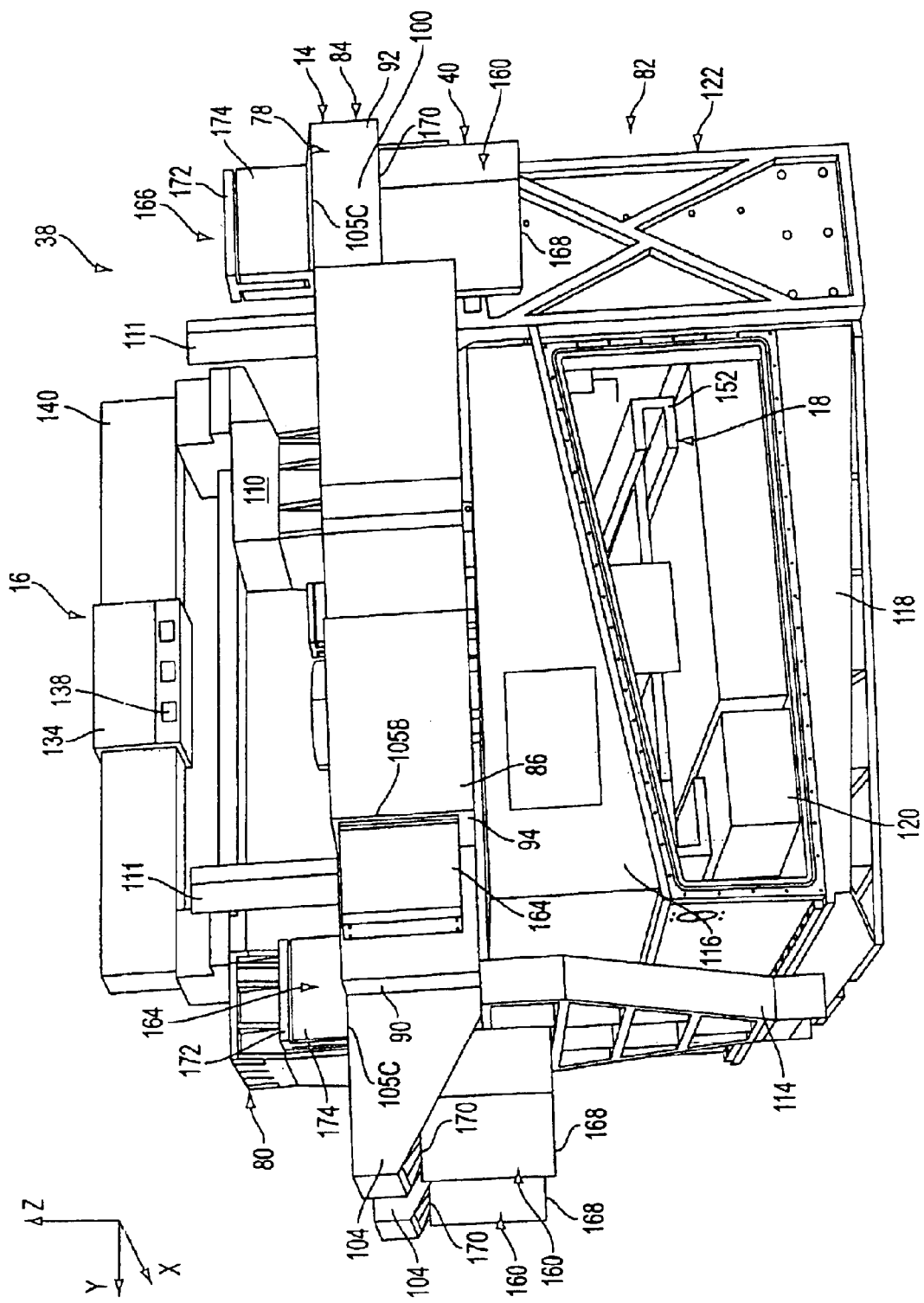
FIG. 8 is a rear left perspective view of the base assembly and the base isolation system of FIG. 7.
Figure 9:
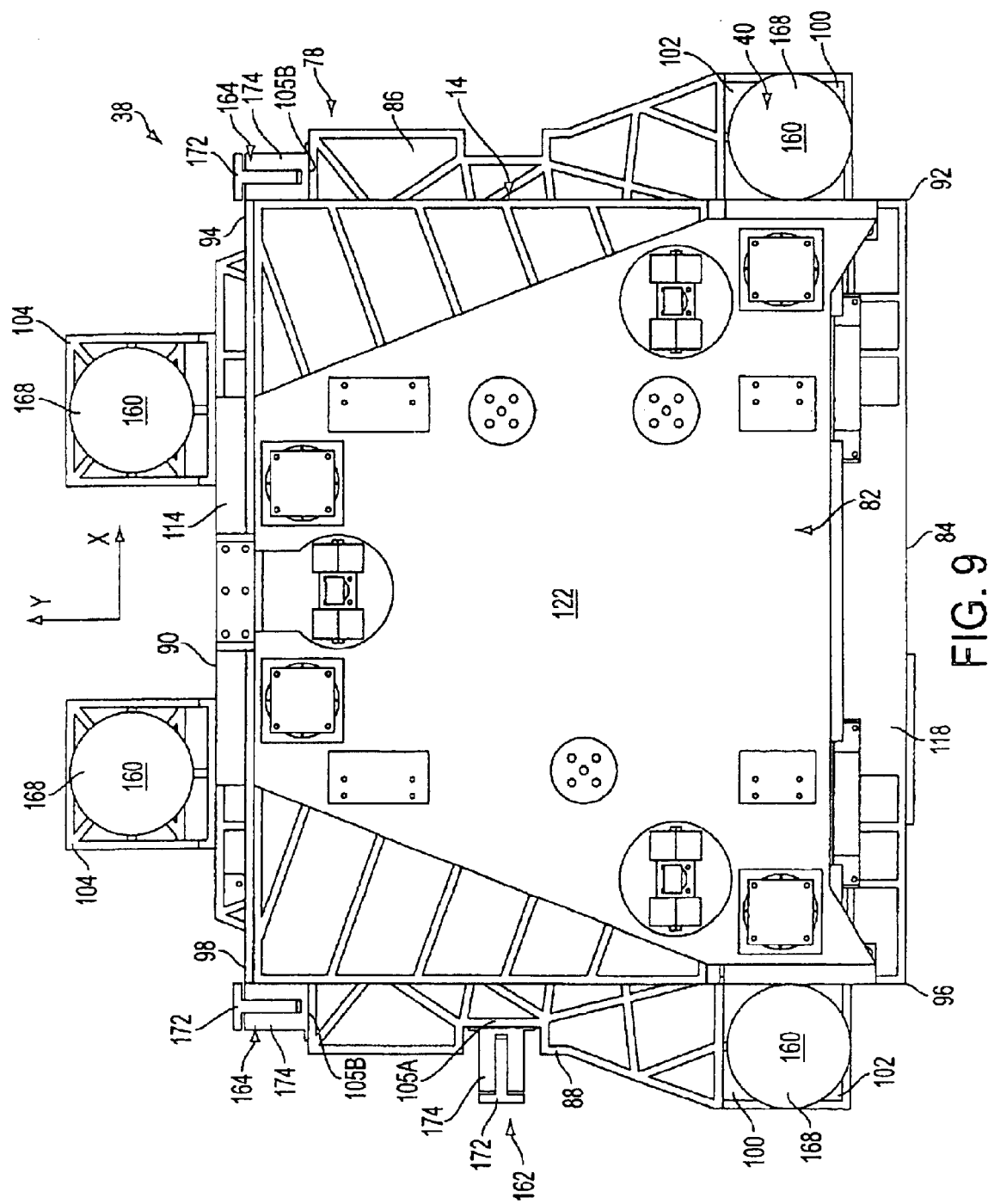
FIG. 9 is a bottom plan view of the base assembly and the base isolation system of FIG. 7.
Figure 10:
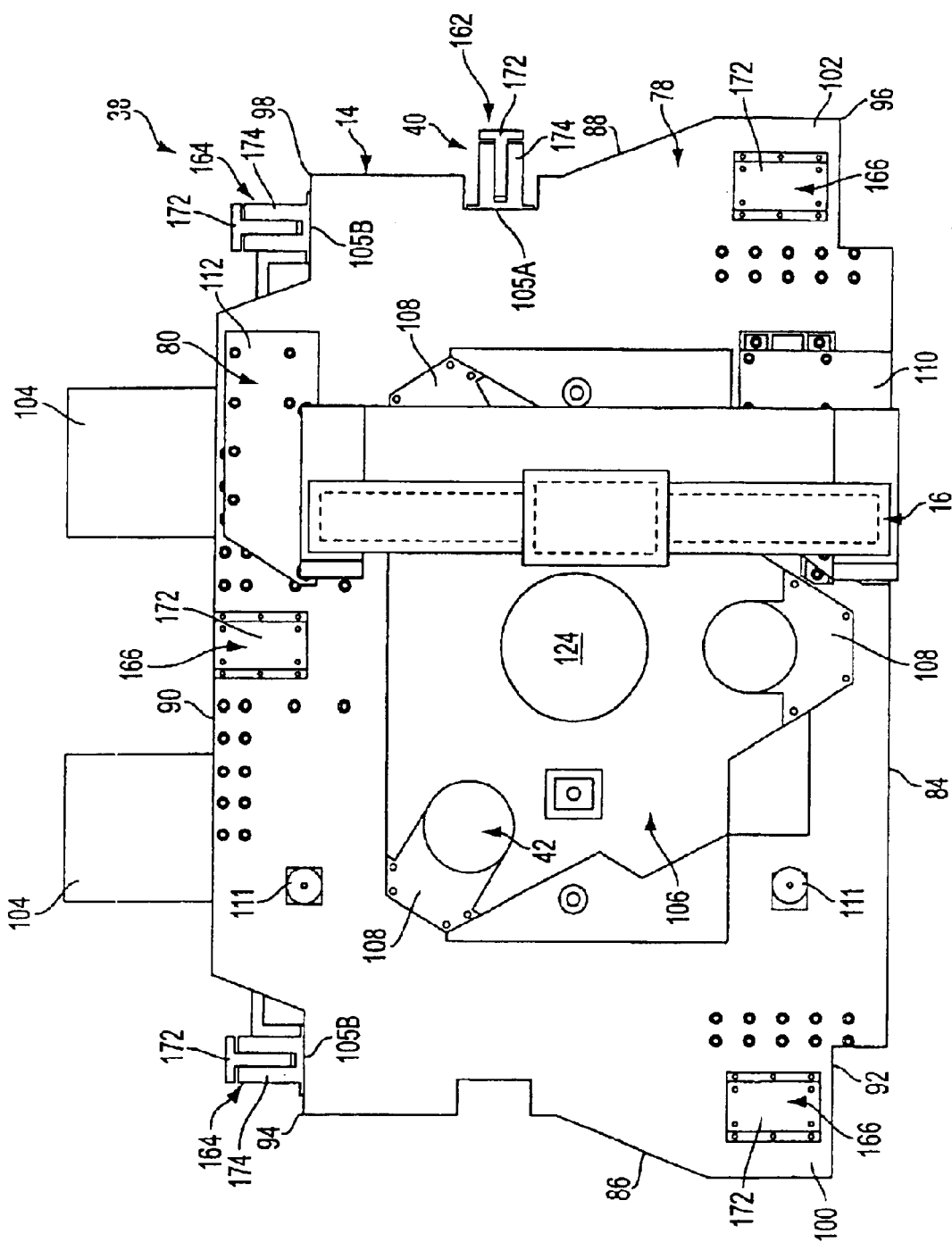
FIG. 10 is a top plan view of the base assembly and the base isolation system of FIG. 7.

The design of the support frame 12 can be varied to suit the design requirements of the other components of the exposure apparatus 10. FIGS. 5 and 6 illustrate a support frame 12 having features of the present invention. In this embodiment, the support frame 12 is generally rectangular frame shaped and includes (i) a front frame 44, (ii) a left frame 46, (iii) a right frame 48, and (iv) a rear frame 50 that are connected together. Importantly, the front frame 44 includes a frame opening 51 that provides space for installing the second stage assembly (not illustrated in FIGS. 5 and 6). The support frame 12 has a support front left corner 52, a support rear left corner 54, a support front right corner 56, and a support rear right corner 58.

The support frame 12 includes (i) a F/L base support mount 60 located near the support front left corner 52, (ii) a F/R base support mount 62 located near the support front right corner 56, (iii) a pair of rear base support mounts 64 located along the rear frame 50, (iv) a X base mover mount 66 that is secured to the right frame 48, (v) two spaced apart Y base mover mounts 68 that are secured to the rear frame 50 and (vi) three spaced apart Z base mover mounts 70. Two of the Z base mover mounts 70 are secured to the front frame 44 and one of the Z base mover mounts 70 is mounted to the rear frame 50. These base mounts 60, 62, 64, 66, 68, 70 are used to secure the base isolation system 40 to the support frame 12. In the embodiment illustrated herein, the rear base support mounts 64 are removable from the rest of the support frame 12 to facilitate shipping of the exposure apparatus 10.

The support frame 12 also defines (i) a X assembly mover mount 72 that is secured to the rear frame 50, (ii) two spaced apart Y assembly mover mounts 74 that are mounted to the rear frame 50 and (iii) three spaced apart Z assembly mover mounts 76. One of the Z assembly mover mounts 76 is secured to the front frame 44 and two of the Z assembly mover mounts 76 are secured to the rear frame 50. The assembly mover mounts 72, 74, 76 are used for securing a portion of the optical isolation system 42 to the support frame 12.

Although not illustrated in the Figures, the support frame 12 could also be designed to transfer the reaction forces from the first stage assembly 16 and/or the second stage assembly 18 to the mounting base 30.

The base assembly 38 includes the base frame 14, a portion or all of the first stage assembly 16, and the second stage assembly 18. The base frame 14 supports the components of the base assembly 38 above the support frame 12 and the mounting base 30. Further, the base frame 14 supports the optical assembly 36 spaced apart from the support frame 12 and the mounting base 30.

The design of the base frame 14 can be varied to suit the design requirements of the other components of the exposure apparatus 10. FIGS. 7–11, illustrate a base frame 14 and a base isolation system 40 having features of the present invention. In this embodiment, the base frame 14 includes (i) a central body frame 78, (ii) a first stage mount assembly 80, and (ii) a second stage mount assembly 82.

Figure 11:
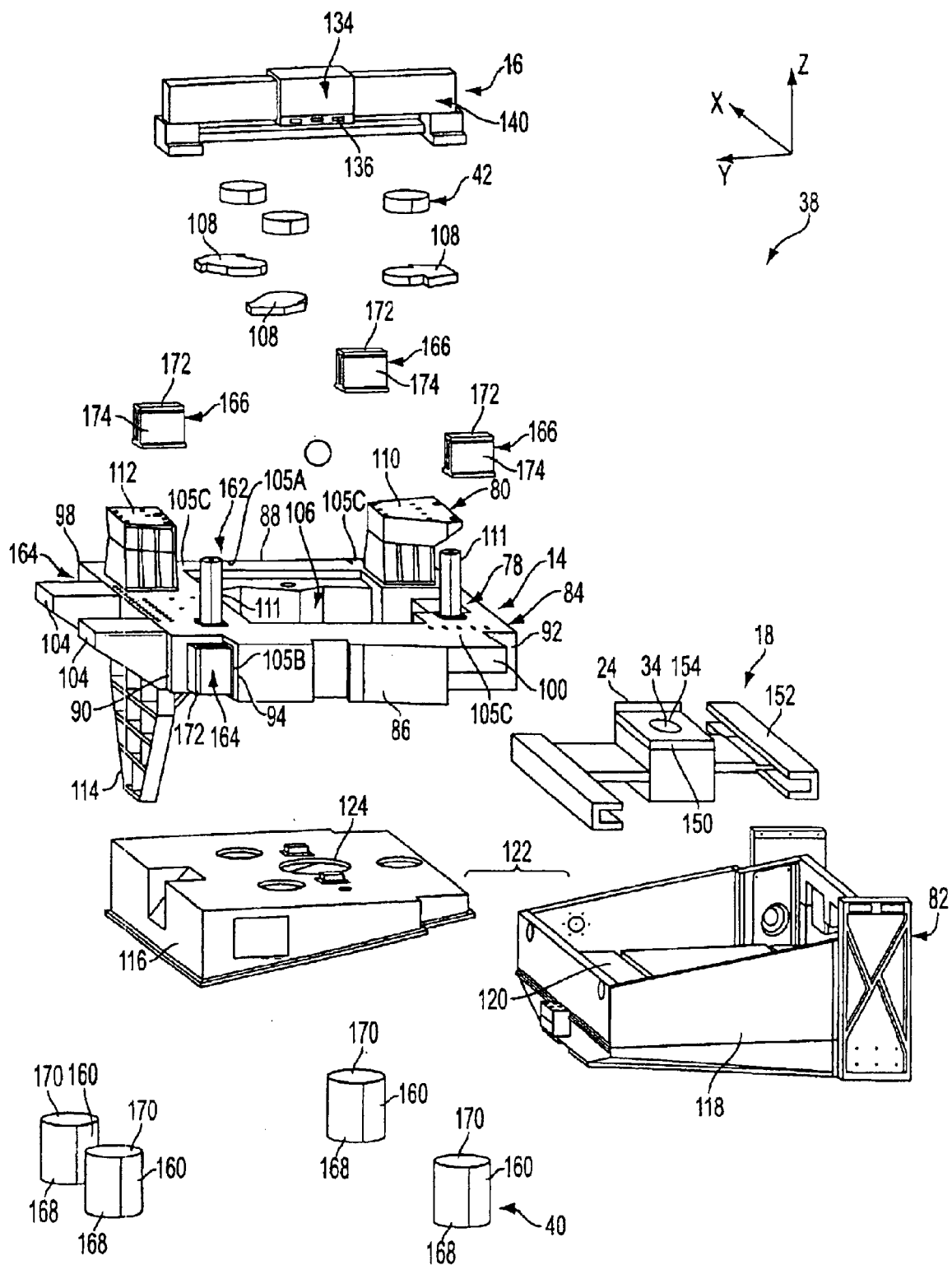
FIG. 11 is an exploded perspective view of the base assembly and the base isolation system of FIG. 7.
Figure 12:
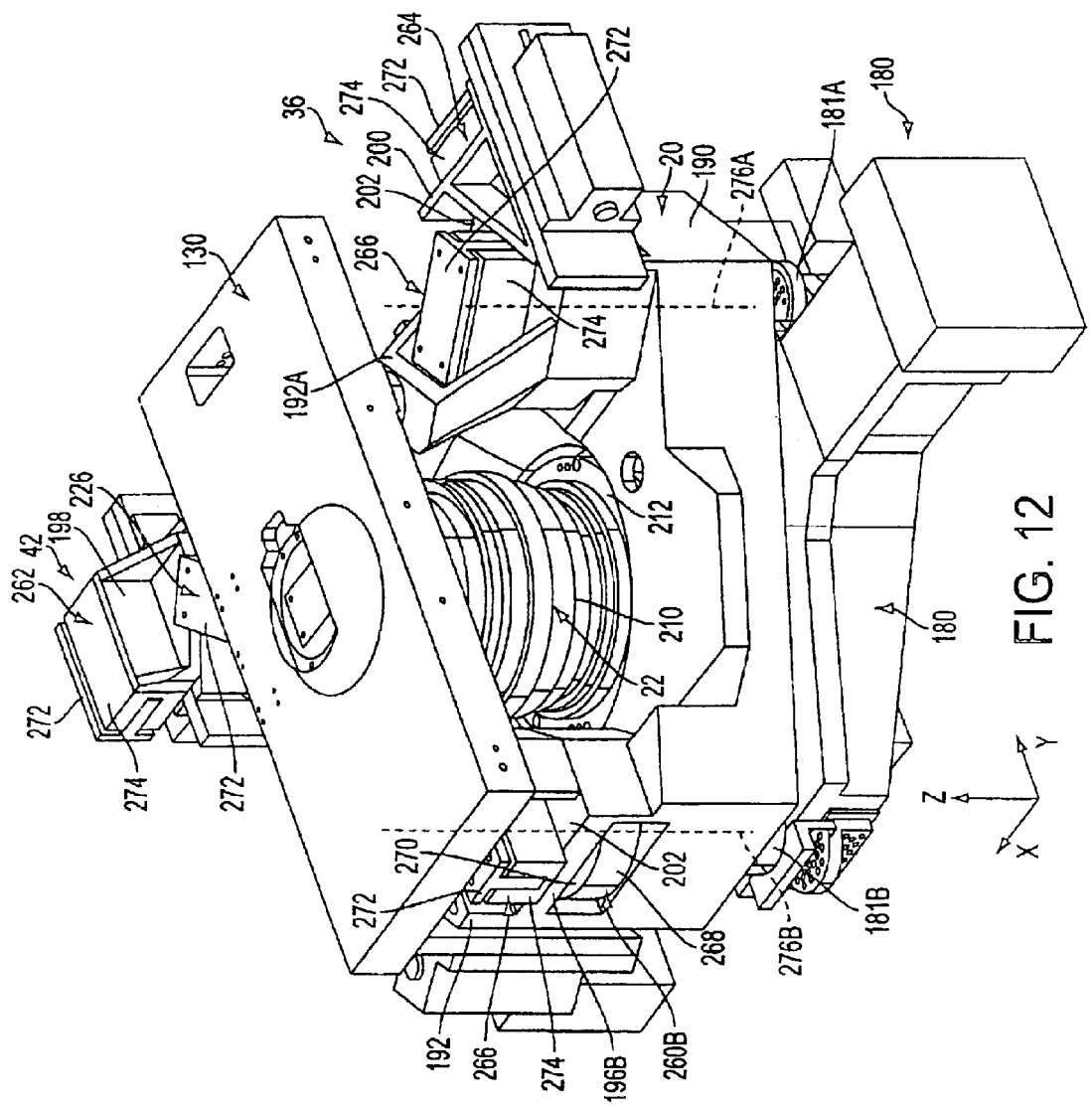
FIG. 12 is a perspective view of an optical assembly and an optical isolation system having features of the present invention.
Figure 13:
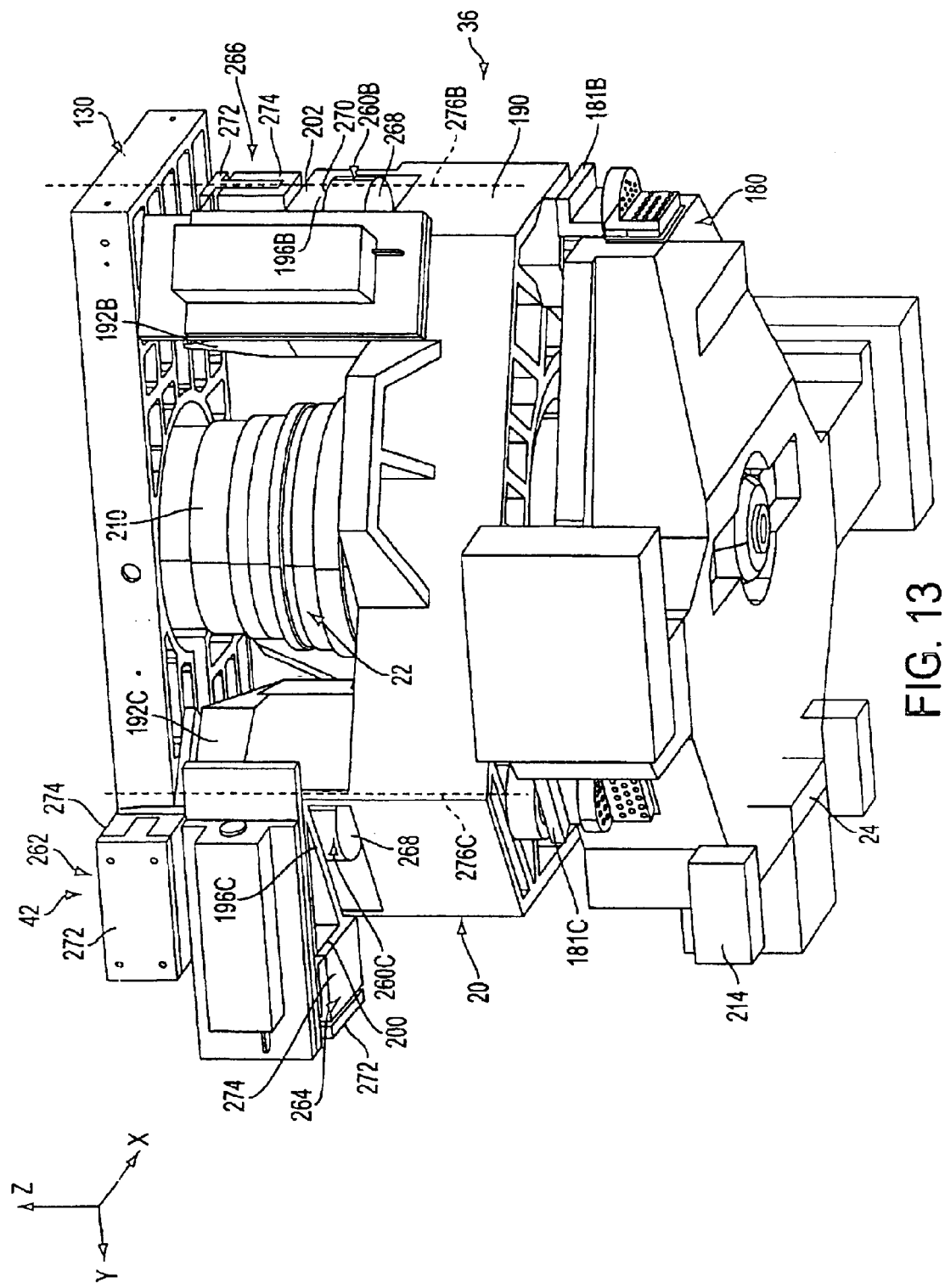
FIG. 13 is another perspective view of the optical assembly and the optical isolation system of FIG. 12.
Figure 14:
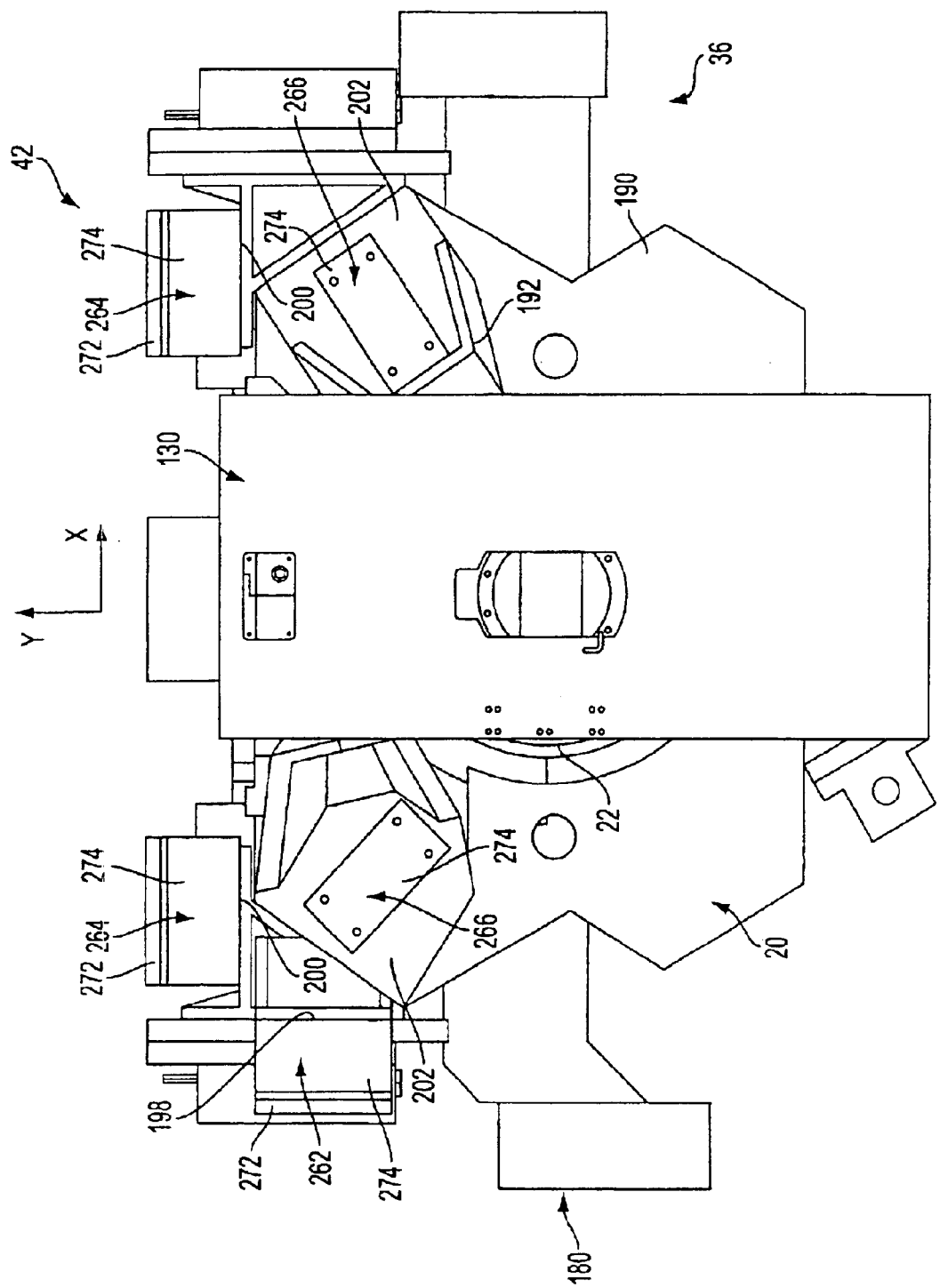
FIG. 14 is a top plan view of the optical assembly and the optical isolation system of FIG. 12.

As can best be seen with reference to FIG. 11, the central body frame 78 is somewhat rectangular frame shaped and includes (i) a front body side 84, (ii) a left body side 86, (iii) a right body side 88, and (iv) a rear body side 90. The central body frame 78 has a body front left corner 92, a body rear left corner 94, a body front right corner 96, and a body rear right corner 98.

The central body frame 78 includes (i) a F/L base support mount 100 located near the body front left corner 92, (ii) a F/R base support mount 102 located near the body front right corner 96, (iii) a pair of rear base support mounts 104 located along the rear body side 90, (iv) a X base mover mount 105A that is secured to the right body side 88, (v) a two spaced apart Y base mounts 105B that are secured to the body rear left corner 94 and the body rear right corner 98, and (vi) three spaced apart Z base mounts 105C. One of the Z base mounts 105C is mounted to the body front left corner 92, one of the Z base mounts 105C is mounted to the body front right corner 96 and one of the Z base mounts 105C is secured to the rear body side 90. As provided below, the base mounts 100, 102, 104, 105A, 105B, 105C are used for securing the base isolation system 40 to the central body frame 78. In the embodiment illustrated herein, the base support mounts 100, 102, 104 are positioned on an outer perimeter of the central body frame 78.

The central body frame 78 also defines a base frame aperture 106 that is sized and shaped to receive a portion of the optical assembly 36 and the optical frame 20. The central body frame 78 also includes three assembly support mounts 108 that are positioned, spaced apart, along the perimeter of the base frame aperture 106. It should be noted that the assembly support mounts 108 are at approximately the same height along the Z axis as the base support mounts 100, 102, 104. As a result of this design, the base isolation system 40 and the optical isolation system 42 are at approximately the same height along the Z axis and approximately the same plane. As provided herein, the center of the base isolation system 40 is preferably between approximately zero inches and twelve inches of the center of the optical isolation system 42 along the Z axis. Further, as a result of this design, the optical assembly 36 is "nested," i.e. positioned within the base assembly 38 and the optical device 22 can be accessed relatively easily for service and adjustment. Moreover, this minimizes the distance between the assembly support mounts 108 and the base support mounts 100, 102, 104. As a result thereof, distortion and vibration of the central body frame 78 are minimized. As illustrated in FIG. 11, the assembly support mounts 108 can be removably secured to the central body frame 78 to facilitate assembly of the exposure apparatus 10 (not illustrated in FIG. 11).

Figure 1A:
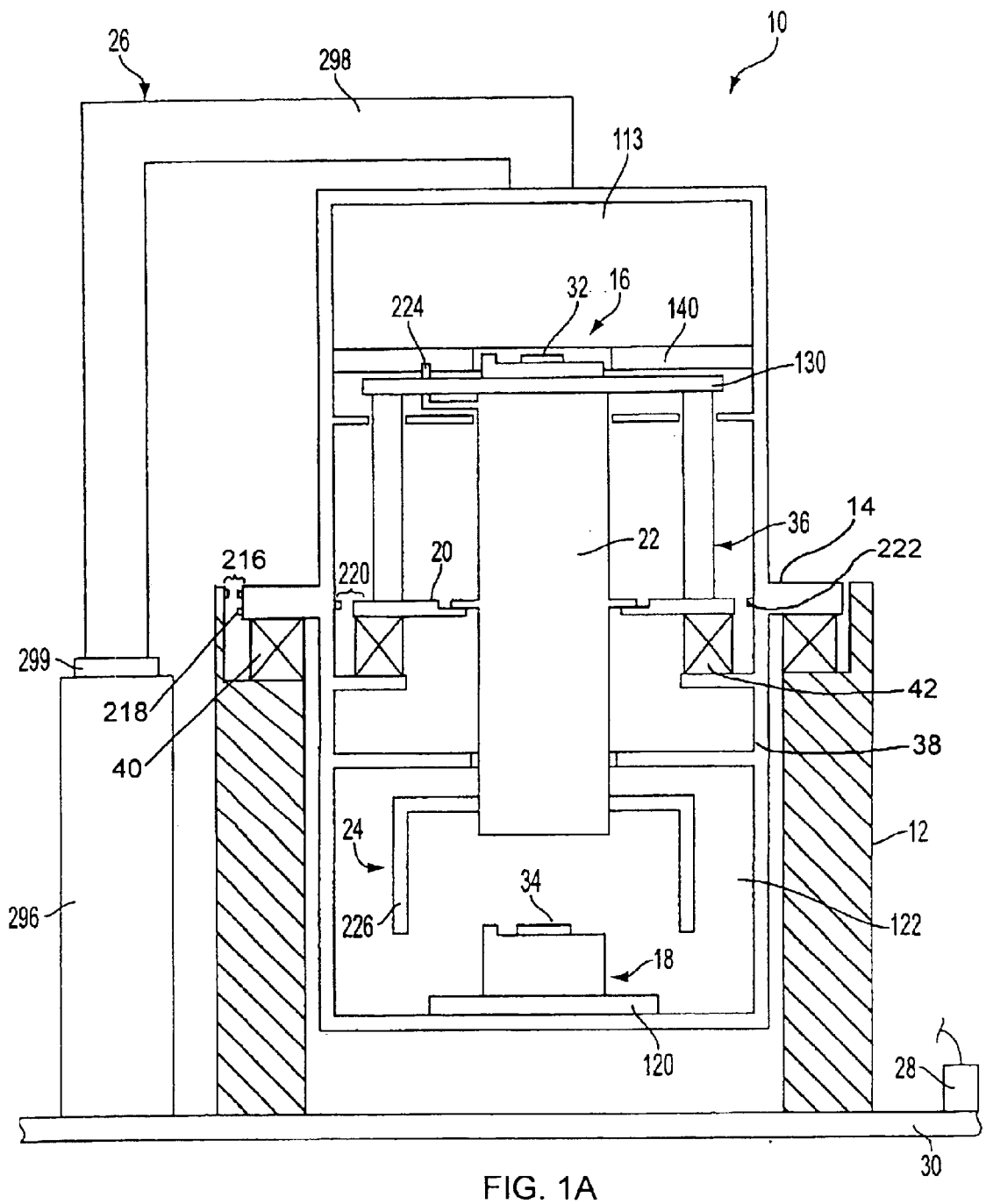
FIG. 1A is a simplified illustration of another embodiment of an exposure apparatus having features of the present invention.

FIG. 1A is a simplified illustration of another embodiment of an exposure apparatus 10 having features of the present invention. This embodiment contains the same elements as the embodiment of the exposure apparatus 10 illustrated in FIG. 1. For example, this embodiment includes the base assembly 38 that is isolated from the support frame 12 with the base isolation system 40 and the optical assembly 36 that is isolated from the base assembly 38 with the optical isolation system 42. However, in the embodiment illustrated in FIG. 1A, the base frame 14 and the support frame 12 are designed so that the base isolation system 40 is positioned at exactly the same height as the optical isolation system 42. spaced apart, upper container mounts 111 for securing an upper enclosure 113 (illustrated in FIG. 1) to the central body frame 78 around the first stage assembly 16. The upper enclosure 113 is secured to the base frame 14.

The upper enclosure 113 allows the environment around the first stage assembly 16 to be controlled. Depending upon the illumination system 26, the performance of exposure apparatus 10 can be enhanced by controlling the environment around the first stage assembly 16. Typically, the upper enclosure 113 includes four walls, a top and a bottom that cooperate to encircle the first stage assembly 16.

The bottom of the upper enclosure 113 includes upper opening (not shown) and a lower opening (not shown) that allows the beam from the illumination system 26 to travel from the illumination system 26 to the reticle 32 and from the reticle 32 to the optical device 22. Preferably, the upper enclosure 113 also includes an upper flexible seal (not shown) that seals between the upper container 113 and the illumination system 26 and a lower flexible seal (not shown) that seals between the upper enclosure 113 and the optical device 22 around the lower opening and allows for movement of the optical device 22 relative to the upper enclosure 113.

The second stage mount assembly 82 supports the second stage assembly 18 above the mounting base 30. The second stage mount assembly 82 includes (i) a rear beam 114 that extends downward from the central body frame 78 near the rear body side 90, (ii) an upper section 116, and (iii) a lower section 118 that is secured to the bottom of the central body frame 78 and the rear beam 114. In this design, the lower section 118 supports a planar, second stage base 120 of the second stage assembly 18. Further, the upper section 116 is secured to the lower section 118.

Further, the lower section 118 and the upper section 116 cooperate to form a lower enclosure 122 that encircles the second stage assembly 18. The lower enclosure 122 allows for the control of the environment around the second stage assembly 18. Depending upon the illumination system 26, the performance of exposure apparatus 10 can be enhanced by controlling the environment around the second stage assembly 18. The lower enclosure 122 is secured to the base frame 14.

A top of the lower enclosure 122 includes an upper opening 124 (illustrated in FIGS. 10 and 11) that allows the beam from the illumination system 26 to travel from the optical device 22 to the device 34. Preferably, the lower enclosure 122 also includes a flexible seal (not shown) that seals between the lower enclosure 122 and the optical device 22 around the upper opening 124 and allows for movement of the optical device 22 relative to the lower enclosure 122.

Although not illustrated in the Figures and not preferred, the base frame 14 could alternately be designed to transfer the reaction forces from the optical isolation system 42 to the support frame 12 and the mounting base 30.

The first stage assembly 16 holds and positions one or more reticles 32 relative to the optical device 22 and the device 34. For an exposure apparatus 10 used to manufacture semiconductor wafers, the first stage assembly 16 is commonly referred to as a reticle stage assembly. The design of the first stage assembly 16 and the components of the first stage assembly 16 can be varied to suit the design and movement requirements of the exposure apparatus 10. For example, referring back to FIG. 2, the first stage assembly 16 includes a first stage base 130, a fine stage 132, a coarse stage 134, a fine stage mover assembly 136 (illustrated in phantom), a coarse stage mover assembly 138 (illustrated in phantom) and a first reaction assembly 140.

As an overview, in the embodiment illustrated in the figures, the stage mover assemblies 136, 138 collectively move the fine stage 132 along the X axis, along the Y axis and about the Z axis (three degrees of freedom) relative to the first stage base 130. Alternately, the first stage assembly 16 could be designed so that the stage mover assemblies 136, 138 move the fine stage 132 along the X axis, the Y axis and the Z axis and about the X axis, the Y axis and the Z axis (six degrees of freedom) relative to the first stage base 130.

The first stage base 130 supports the fine stage 132 during movement The design of the first stage base 130 can be varied to suit the design requirements of the first stage assembly 16. Typically, the first stage base 130 includes a planar upper base surface. The first stage base 130 also includes a base aperture that extends through the first stage base 130 and allows for the passage of the beam of light energy through the first stage base 130.

In the embodiment illustrated in the Figures, because the fine stage 132 is moved with only three degrees of freedom relative to the first stage base 130, the first stage base 130 is secured to the optical device 22 and is part of the optical assembly 36. With this design, the position of the fine stage 132 relative to the optical device 22 is maintained along the Z axis, about the X axis and about the Y axis.

Alternately, if the fine stage 132 is moved with six degrees of freedom relative to the first stage base 130, the first stage base 130 could be secured to the base frame 14 and could be part of the base assembly 38.

The fine stage 132 retains one or more objects, e.g. reticles 32. The design illustrated in the Figures is designed to retain a single reticle 32. More specifically, referring to FIG. 2, the fine stage 132 includes a first holder 144 and a portion of the measurement system 24. The first holder 144 retains the one or more reticles 32 and can include a vacuum chuck, an electrostatic chuck, or some other type of clamp.

A bottom of the fine stage 132 includes a plurality of spaced apart fluid outlets (not shown) and a plurality of spaced apart fluid inlets (not shown). Pressurized fluid (not shown) is released from the fluid outlets towards the first stage base 130 and a vacuum is pulled in the fluid inlets to create a vacuum preload type, fluid bearing between the fine stage 132 and the first stage base 130. The vacuum preload type, fluid bearing maintains the fine stage 132 spaced apart along the Z axis relative to the first stage base 130 and allows for motion of the fine stage 132 along the X axis, the Y axis and about the Z axis relative to the first stage base 130. Alternately, the fine stage 132 can be supported above the first stage base 130 by alternate ways such as magnetic type bearing (not shown) or a roller type bearing (not shown).

The coarse stage 134 is generally rectangular tube shaped and moves along the first reaction assembly 140. The coarse stage 134 can be supported relative to the first reaction assembly 140 with a vacuum type fluid bearing, a magnetic type bearing, a roller type bearing, or some other type of guide.

The fine stage mover assembly 136 precisely moves the fine stage 132 relative to the coarse stage 134 and the first stage base 130, and the coarse stage mover assembly 138 moves the coarse stage 134 and the fine stage 132 relative to the first reaction assembly 140. The design of the stage mover assemblies 136, 138 can be varied to suit the movement requirements of the first stage assembly 16. For example, each of the stage mover assemblies 136, 138 can include one or more rotary motors, voice coil motors, linear motors, electromagnetic actuators, and/or other type of actuators. As provided herein, the fine stage mover assembly 136 can include a plurality of spaced apart actuators (not shown) that interact to selectively move the fine stage 132 relative to the first stage base 130 and the coarse stage 134. Further, the coarse stage mover assembly 138 can include a linear motor (not shown) that moves the coarse stage 134 and the fine stage 132 relative to the first reaction assembly 140.

The first reaction assembly 140 reduces and minimizes the amount of reaction forces from the stage mover assemblies 136, 138 that are transferred to the base frame 14. The first reaction assembly 140 is supported above the base frame 14 with the upper mounts 110, 112. Further, the first reaction assembly 140 moves relative to the upper mounts 110, 112 with a vacuum type, fluid bearing, a magnetic type bearing, a roller type bearing, or some other type of guide. Through the principle of conservation of momentum, movement of the coarse stage 134 with the coarse stage mover assembly 138 in one direction, moves the first reaction assembly 140 in the opposite direction along the Y axis. The first reaction assembly 140 inhibits the reaction forces from the stage mover assemblies 136, 138 from significantly influencing the position of the base assembly 38.

The second stage assembly 18 holds and positions one or more devices 34 relative to the projected image of the illuminated portions of the reticle 32. For an exposure apparatus 10 used to manufacture semiconductor wafers, the second stage assembly 18 is commonly referred to as a wafer stage assembly. The design of the second stage assembly 18 and the components of the second stage assembly 18 can be varied to suit the design requirements of the exposure apparatus 10. FIG. 11 illustrates a second stage assembly 18 having features of the present invention. In this embodiment, the second stage assembly 18 includes the second stage base 120, a second stage 150, and a second stage mover assembly 152. Importantly, the second stage assembly 18 can be installed as a module into the base assembly 38. This feature facilitates assembly of the exposure apparatus 10.

The second stage base 120 guides and supports the second stage 150. As provided above, in the embodiment illustrated in the Figures, the second stage base 120 is secured to the lower section 118 of base frame 14.

The second stage 150 includes a holder 154 for retaining one or more devices 34 and a portion of the measurement system 24. The holder 154 can be a vacuum chuck, an electrostatic chuck, or some other type of clamp. Additionally, the second stage 150 includes a plurality of spaced apart, fluid outlets (not shown), and a plurality of spaced apart, fluid inlets (not shown) directed towards the second stage base 120. Pressurized fluid (not shown) is released from the fluid outlets towards the second stage base 120, and a vacuum is pulled in the fluid inlets to create a vacuum preload type, fluid bearing between the second stage 150 and second stage base 120. The vacuum preload type, fluid bearing maintains a portion of the second stage 150 spaced apart along the Z axis relative to the second stage base 120 and allows for motion of the second stage 150 relative to the second stage base 120. Alternately, the second stage 150 can be supported spaced apart from the second stage base 120 by other ways, such as a magnetic type bearing, a roller type bearing, or another type of bearing.

The second stage mover assembly 152 moves the second stage 150 relative to the second stage base 120. Preferably, the second stage mover assembly 152 moves the second stage 150 relative to the second stage base 120 along the X axis, the Y axis and the Z axis, and about the X axis, the Y axis and the Z axis. Alternately, for example, the second stage mover assembly 152 could be designed to move the second stage 150 relative to the second stage base 120 along the X axis, along the Y axis, about the Z axis. The second stage mover assembly 152 can include one or more rotary motors, voice coil motors, linear motors, electromagnetic actuators, and/or some other type of actuators.

Preferably, the second stage mover assembly 152 is coupled to a reaction frame (not shown). In this design, the reaction forces from the second stage mover assembly 152 are transferred to the mounting base 30 with the reaction frame. Alternately, for example, the reaction forces from the second stage mover assembly 152 can be transferred to the support frame 12. Still alternately, a reaction mass assembly (not shown) could be utilized with the stage mover assembly 152 to minimize the reaction forces that are transferred to the second stage base 120.

The base isolation system 40 secures the base frame 14 and the base assembly 38 to the support frame 12. With this design, the components of the base assembly 38 are isolated from the mounting base 30 and the support frame 12. Stated another way, the base isolation system 40 reduces the effect of vibration of the support frame 12 and the mounting base 30 from causing vibration the components of the base assembly 38.

The design of the base isolation system 40 can be varied. For example, referring to FIGS. 7–11, the base isolation system 40 can include (i) four spaced apart base flexible supports 160, (ii) one X base mover 162, (iii) two spaced apart Y base movers 164, and (iv) three spaced apart Z base movers 166. Alternately, for example, the base isolation system 40 could include only three base flexible supports 160.

The base flexible supports 160 support the weight of the base assembly 38 and the optical assembly 36, while remaining low in stiffness for good passive vibration isolation. Stated another way, the base flexible supports 160 attenuate movements of the base assembly 38. The design of the base flexible supports 160 can be varied. In the embodiment illustrated in the Figures, each of the base flexible supports 160 is a pneumatic cylinder. In this design, the pneumatic cylinder acts as an air spring. The pressure of the fluid in the pneumatic cylinder is actively controlled by the control system 28 to compensate for low frequency disturbances such as a shift in the center of gravity in one the stage assemblies 16, 18 and to adjust the position of the base assembly 38. Alternately, for example, one or more of the base flexible supports 160 could be a mechanical spring (not shown) or an actuator.

Each of the base flexible supports 160 includes a lower end 168 that is secured to the support frame 12 and an upper end 170 that is secured to the base frame 14. More specifically, for each of the flexible supports 160, the lower end 168 is secured to one of the base support mounts 60, 62, 64 of the support frame 12 and the upper end 170 is secured to one of the base support mounts 100, 102, 104 of the base frame 14.

In the embodiment illustrated in the Figures, air pressure in the base flexible supports 160 is individually controlled to (i) adjust the static or low frequency position of the base assembly 38 and (ii) improve vibration isolation by reducing the stiffness. Thus, the base flexible supports 160 can be used to adjust the position of the base assembly 38 relative to the support frame 12. the base flexible supports 160 can be active or passive. If active, some feedback of air pressure (if air mount), position(s) and acceleration(s) is necessary.

The base movers 162, 164, 166 actively dam and control the position of the base assembly 38 relative to the support frame 12 with six degrees of freedom. More specifically, the X base mover 162 moves the base assembly 38 along the X axis relative to the support frame 12, the Y base movers 164 move the base assembly 38 along the Y axis relative to the support frame 12, and the Z base movers 166 move the base assembly 38 along the Z axis relative to the support frame 12. Further, the two Y base movers 164 cooperate to move the base assembly 38 about the Z axis relative to the support frame 12 and the three Z base movers 166 cooperate to move the base assembly 38 about the X axis and about the Y axis relative to the support frame 12.

The design of the base movers 162, 164, 166 can be varied. In the embodiment illustrated in the Figures, each of the base movers 162, 164, 166 is a voice-coil motor (VCM). Alternately, each of the base movers 162, 164, 166 could be a linear motor, an electromagnetic actuator or some other type of actuator. The control system 28 directs and controls current to each of the base movers 162, 164, 166 to actively dam
and control the position of the base assembly 38 with six degrees of freedom relative to the support frame 12.

In this design, each of the base movers 162, 164, 166 includes a first component 172 that is secured to the support frame 12 and a second component 174 that is secured to the base frame 14. More specifically, in this design, (i) for the X base mover 162, the first component 172 is secured to the X base mover mount 66 of the support frame 12 and the second component 174 is secured to the X base mover mounts 105A of the base frame 14, (ii) for each of the Y base movers 164, the first component 172 is secured to one of the Y base mover mounts 68 of the support frame 12 and the second component 174 is secured to the one of the Y base mover mounts 105B of the base frame 14, (iii) for each of the Z base movers 166, the first component 172 is secured to one of the Z base mover mounts 70 of the support frame 12 and the second component 174 is secured to one of the Y base mover mounts 105C of the base frame 14.

The optical assembly 36 can include (i) the optical frame 20, (ii) the optical device 22, (iii) a sensor column 180, (iv) a portion of the measurement system 24, (v) the first stage base 130, and (vi) the fine stage 132. As a result of the design provided herein, the optical assembly 36 can be easily removed from the exposure apparatus 10. For example, the optical assembly 36 allows the optical device 22 and the optical frame 20 to be removed from the exposure apparatus 10 as a module. Alternately, for example, the optical assembly 36 can be designed without the first stage base 130 and the fine stage 132.

The optical frame 20 supports the components of the optical assembly 36. The design of the optical frame 20 can be varied to suit the design requirements of the other components of the exposure apparatus 10. FIGS. 12–15 illustrate an optical frame 20 having features of the present invention. In this embodiment, the optical frame 20 includes a center frame 190, a first base mount 192A, a second upper base mount 192B, and a third upper base mount 192C. The upper base mounts 192A, 192B, 192C extend upwardly from the center frame 190.

Importantly, the center frame 190 and the central body frame 78 are approximately at the same height along the Z axis and approximately the same plane to maximize access to the optical device 22.

Figure 15:
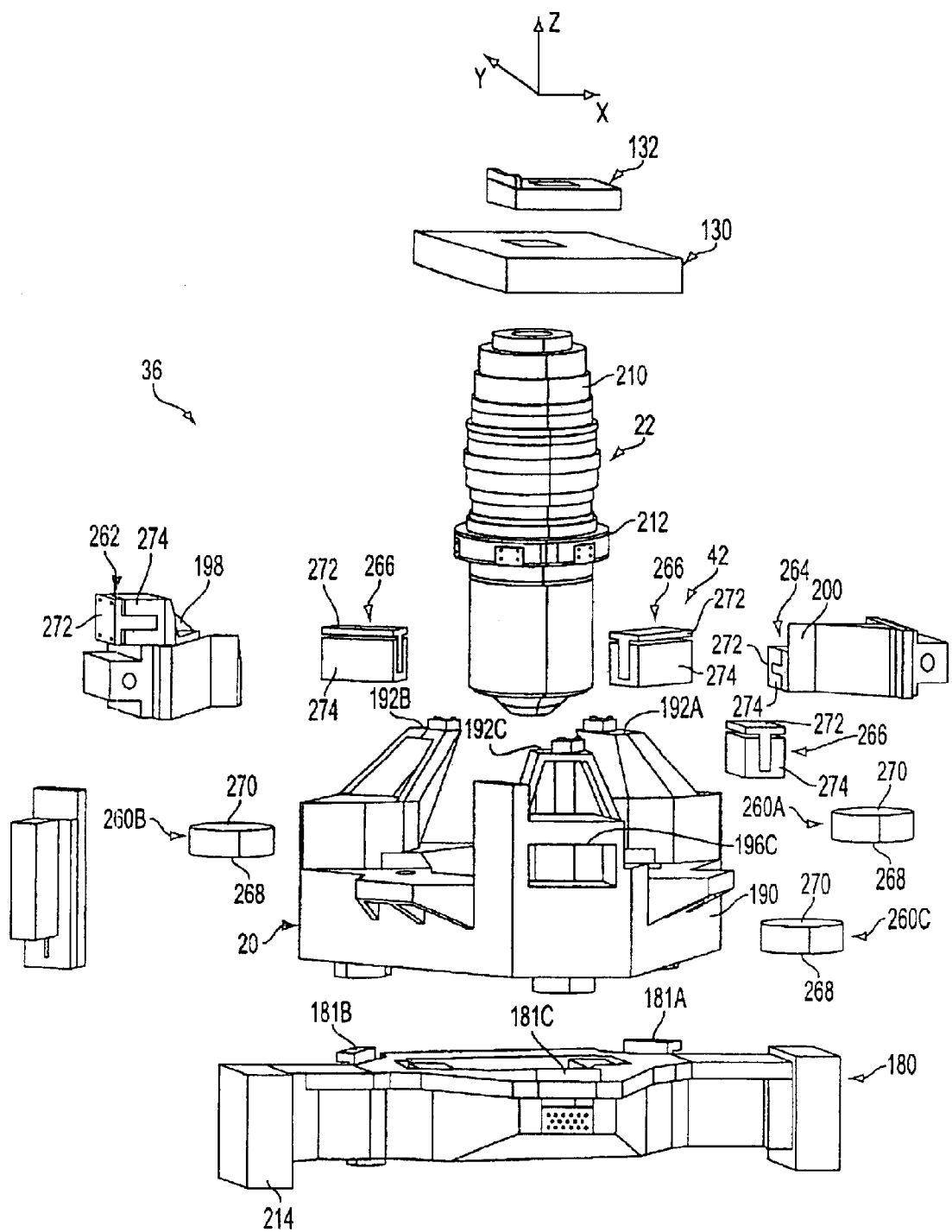
FIG. 15 is an exploded perspective view of the optical assembly and the optical isolation system of FIG. 12.

As can best be seen with reference to FIG. 15, the center frame 190 is somewhat triangular frame shaped and includes an optical frame aperture 194 that is sized and shaped to receive a portion of the optical device 22. The optical device 22 is secured to the center frame 190 around the perimeter of the optical frame aperture 194. The center frame 190 also includes a first assembly support mount 196A, a second assembly support mount 196B, and a third assembly support mount 196C that are spaced apart and positioned along the perimeter of the center frame 190. As provided below, the assembly support mounts 196A, 196B, 196C are used to mount a portion of the optical isolation system 42 to the optical frame 20.

Importantly, the center frame 190 is sized and shaped to fit within the base frame aperture 106 of the base frame 14. With this design, the optical assembly 36 is nested, e.g. positioned within the base assembly 38. This feature improves access to the optical device 22. The three upper stage mounts 192A, 192B, 192C extend upwardly from the center frame 190. The upper stage mounts 192A, 192B, 192C secure the first stage base 130 to the optical frame 20. Because the upper stage mounts 192A, 192B, 192C are spaced apart access to the optical device 22 is provided for repair and adjustment to the optical device 22.

The optical frame 20 also includes (i) an X assembly mover mount 198, (ii) two spaced apart Y assembly mover mounts 200, and (iii) three spaced apart Z optical mover mounts 202 that are secured to the upper stage mounts 192 of the optical frame 20. As provided below, the assembly mover mounts 198, 200, 202 are used to mount a portion of the optical isolation system 42 to the optical frame 20.

The optical device 22 projects and/or focuses the light energy that passes through the optical device 22. The design of the optical device 22 can be varied according to the design requirements of the exposure apparatus 10. For example, the optical device 22 can magnify or reduce the image illuminated on the reticle 32. In terms of the magnification, the optical device 22 can be a reduction system, a 1× system or magnification system. Further, if the illumination system 26 generates ultra-violet rays such as the excimer laser, glass materials such as quartz and flourite that transmit ultra-violet rays are preferably used in the optical device 22. If the illumination system 26 is an F2 laser or an x-ray, the optical device 22 should be either catadioptric or refractive. If the illumination system 26 includes an electron beam, the optical device 22 should consist of electron opticales and deflectors.

The optical device 22 illustrated in the Figures includes an optical housing 210 and one or more optical elements (not shown). The optical housing 210 is substantially tubular or annular shaped and defines an optical chamber (not shown) that is somewhat right, cylindrical shaped. The optical housing 210 includes a ring shaped housing mount 212 that secures the optical device 22 to the center frame 190. Preferably, the housing mount 212 is secured to the optical frame 20 at approximately the same height along the Z axis and the same plane as the optical isolation system 42 and the base isolation system 40 to maximize access to the optical device 22 and minimize distortion of the optical device 22.

Uniquely, with the present design, the optical device 22 can be added to and removed from the exposure apparatus 10 along with the optical frame 20. Further, the optical frame 20 is nested within the base assembly 38 to maximize the access to the optical device 22.

As shown in the Figures, the optical frame 20 supports the first stage base 130 and the fine stage 132. More specifically, the first stage base 130 is secured to the spaced apart upper stage mounts 192. With this design, the optical assembly 36 can be removed from the exposure apparatus 10 after removing the first stage base 130, the fine stage 132, and the rest of first stage assembly 16. This simplifies the assembly and the disassembly of the exposure apparatus 10. Alternately, in another embodiment, the exposure apparatus can be designed so the optical frame 20 does not support the first stage base 130 and the fine stage 132.

The sensor column 180 is secured to the optical frame 20 below the housing mount 212. Preferably, the sensor column 180 is secured to the optical device 22 with a semi-kinematic type attachment. The semi-kinematic type attachment secures the sensor column 180 to the optical device 22 while minimizing distortion to the optical frame 20 and consequently minimizing distortion to the optical device 22. As provided herein, the sensor column 180 includes a first sensor mount 181A, a second sensor mount 181B, and a third sensor mount 181C that are used to secure the sensor column 180 to the optical frame 20.

The sensor column 180 supports a portion of the measurement system 24 that monitors the position of the second stage 150 relative to the optical device 22 and one or more alignment sensors 214 for monitoring the alignment of the device 34 relative to the optical device 22.

The measurement system 24 monitors the relative positions of some of the components of the exposure apparatus 10. The design of the measurement system 24 can be varied. The measurement system 24 can utilize one or more laser interferometers, encoders, position sensor, acceleration sensors and/or other measuring devices.

Referring back to FIG. 1, the measurement system 24 can include (i) a plurality of spaced apart base position sensors 216 (only one is illustrated) for the monitoring the position of the base assembly 38 relative to the support frame 12, (ii) a plurality of spaced apart base acceleration sensors 218 (only one is illustrated) for monitoring the absolute acceleration of the base assembly 38 relative to the support frame 12, (iii) a plurality of spaced apart assembly position sensors 220 (only one is illustrated) for monitoring the position of the optical assembly 36 relative to the base assembly 38 and/or relative to the support frame 12, (iv) a plurality of spaced apart assembly acceleration sensors 222 (only one is illustrated) for monitoring the absolute acceleration of the optical assembly 36 relative to the base assembly 38, (v) an upper interferometer system 224 for monitoring the position of the fine stage 132 relative to the optical device 22, and (vi) a lower interferometer system 226 for monitoring the position of the second stage 150 relative to the optical device 22.

The position and acceleration of the base assembly 38 relative to the support frame 12 is monitored by the plurality of spaced apart base position sensors 216, and the plurality of base acceleration sensors 218. With information from these base sensors 216, 218, the control system 28 can cooperate with the base isolation system 40 to adjust and control the position of the base frame 14 relative to the support frame 12 with six degrees of freedom. Stated another way, this feature allows the control system 28 to center and isolate the base assembly 38 relative to the support frame 12. The embodiment provided herein utilizes six spaced apart base position sensors 216 (only one illustrated) and six spaced apart base acceleration sensors 218 (only one illustrated).

The position and acceleration of the optical assembly 36 relative to the base assembly 38 is monitored by the plurality of spaced apart assembly position sensors 220, and the plurality of spaced apart assembly acceleration sensors 222. With information from these assembly sensors 222, 224, the control system 28 can cooperate with the optical isolation system 42 to adjust and control the position of the optical frame 20 relative to the base frame 14 with six degrees of freedom. Stated another way, this feature allows the control system 28 to center and isolate the optical assembly 36 relative to the base assembly 38. The embodiment provided herein utilizes six spaced apart assembly position sensors 220 (only one is illustrated) and six spaced apart assembly acceleration sensors 222.

The optical isolation system 42 secures the optical frame 20 and the optical assembly 36 to the base frame 14. With this design, the components of the optical assembly 36 are isolated from the base assembly 38, the mounting base 30 and the support frame 12. Stated another way, the optical isolation system 42 reduces the effect of vibration of the base assembly 38, the support frame 12 and the mounting base 30 from causing vibration the components of the optical assembly 36.

The design of the optical isolation system 42 can be varied. For example, the optical isolation system 42 can include (i) a first assembly flexible support 260A, (ii) a second assembly flexible support 260B, (iii) a third assembly flexible support 260C, (iv) an X assembly movers 262, (v) two spaced apart Y assembly movers 264, and (vi) three spaced apart Z optical movers 266. In the embodiment illustrated in the Figures, the optical isolation system 42 and the assembly flexible supports 260A, 260B, 260C are spaced apart The assembly flexible supports 260A, 260B, 260C support the weight of the optical assembly 36, while remaining low in stiffness for good passive vibration isolation. Further, the assembly flexible supports 260A, 260B, 260C attenuate movement. The design of the assembly flexible supports 260A, 260B, 260C can be varied. In the embodiment illustrated in the Figures, each of the assembly flexible supports 260A, 260B, 260C is a pneumatic cylinder. In this design, the pneumatic cylinder acts as an air spring. The pressure of the fluid in the pneumatic cylinder is actively controlled by the control system 28 to compensate for low frequency disturbances such as a shift in the center of gravity in the first stage assembly 16. Alternately, one or more of the assembly flexible supports 260A, 260B, 260C could be a mechanical spring or an actuator.

Each of the assembly flexible supports 260A, 260B, 260C includes a lower end 268 that is secured to the base frame 14 and an upper end 270 that is secured to the optical frame 20. More specifically, the lower end 268 of each of the assembly flexible supports 260A, 260B, 260C is secured to one of assembly support mounts 108 of the base frame 14 and the upper end 270 is secured to one of the assembly support mounts 196A, 196B, 196C of the optical frame 20.

In the embodiment illustrated in the Figures, air pressure in the assembly flexible supports 260A, 260B, 260C is individually controlled to (i) adjust the static or low frequency position of the optical assembly 36 and (ii) improve vibration isolation by reducing the stiffness. Thus, the optical flexible supports 260A, 260B, 260C can be used to adjust the position of optical assembly 36 relative to the base assembly 38. the optical flexible supports 260A, 260B, 260C can be active or passive. If active, some feedback of air pressure (if air mount), position(s), and acceleration(s) is necessary.

The assembly movers 262, 264, 266 actively dam and control the position of the optical assembly 36 relative to the support frame 12 and the base assembly 38 with six degrees of freedom. More specifically, (i) the X assembly mover 262 moves the optical assembly 36 along the X axis relative to the support frame 12 and the base assembly 38, (ii) the Y assembly movers 264 move the optical assembly 36 along the Y axis relative to the support frame 12 and the base assembly 38, and (iii) the Z assembly movers 266 move the optical assembly 36 along the Z axis relative to the support frame 12 and the base assembly 38. Further, (i) the Y assembly movers 264 cooperate to move the optical assembly 36 about the Z axis relative to the support frame 12 and the base assembly 38, and (ii) the Z assembly movers 266 cooperate to move the optical assembly 36 about the X axis and about the Y axis relative to the support frame 12 and the base assembly 38.The design of the assembly movers 262, 264, 266 can be varied. In the embodiment illustrated in the Figures, each of the assembly movers 262, 264, 266 is a voice-coil motor (VCM). Alternately, each of the assembly movers could be a linear motor, an attraction only actuator, or some other type of actuator. The control system 28 directs and controls current to each of the assembly movers 262, 264, 266 to actively dam and control the position of the optical assembly 36 with six degrees of freedom relative to the base assembly 38.

In this design, each of the assembly movers 262, 264, 266 includes a first component 272 that is secured to the support frame 12 and a second component 274 that is secured to one of the assembly support mounts 196 of the optical frame 20. More specifically, in this design, (i) the X assembly mover 262, the first component 272 is secured to the X assembly mover mount 72 of the support frame 12 and the second component 274 is secured to the X assembly mover mount 198 of the optical frame 20, (ii) for each of the Y assembly movers 264, the first component 272 is secured to one of the Y assembly mover mounts 74 of the support frame 12 and the second component 274 is secured to one of the Y mover mounts 200 of the optical frame 20, and (iii) for each of the Z assembly movers 266, the first component 272 is secured to one of the Z assembly mover mounts 76 of the support frame 12 and the second component 274 is secured to one of the Z assembly mover mounts 202 of the optical frame 20. With this design, the reaction forces from the assembly movers 262, 264, 266 is transferred to the support frame 12. Stated another way, the reaction forces from the assembly movers 262, 264, 266 bypass the base assembly 38 and are transferred to the mounting base 30 with the support frame 12.

Alternately, for example, the first component 272 of the one or more of the assembly movers 262, 264, 266 can be mounted to the base frame 14. With this design, the reaction forces from the assembly movers 262, 264, 266 will act on the base assembly 38. Still alternately, the first component 272 of the one or more of the assembly movers 262, 264, 266 can be secured to a separate reaction frame (not shown).

Importantly, it should be noted that the components of the optical assembly 36 are uniquely designed to minimize distortion and vibration to the optical device 22 and maximize access to the optical device 22. More specifically, referring to FIGS. 12, 13, and 15 as provided herein, the first sensor mount 181A, a proximal section of the first upper base mount 192A, the first assembly support mount 196A, the first assembly flexible support 260A, and one of the Z assembly movers 266 are substantially coaxial and positioned along a first Z axis 276A. Similarly, the second sensor mount 181B, a proximal section of the second upper base mount 192B, the second assembly support mount 196B, the second assembly flexible support 260B, and one of the Z assembly movers 266 are substantially coaxial and positioned along a second Z axis 276B. Also, the third sensor mount 181C, a proximal section of the third upper base mount 192C, the third assembly support mount 196C, the third assembly flexible support 260C, and one of the Z assembly movers 266 are substantially coaxial and positioned along a third Z axis 276C. As a result of this design, the sensor column 180 can be secured to the optical assembly 36 without distorting the optical device 22. Similarly, the first stage base 130 can be secured to the optical assembly 36 without distorting the optical device 22.

The control system 28 controls (i) the fine stage mover assembly 136 and the coarse stage mover assembly 138 to precisely position the fine stage 132 and (ii) the second stage mover assembly 152 to precisely position the second stage 150 relative to the optical device 22. Further, the control system 28 directs and controls the current (i) to base movers 162, 164, 166 to move and position the base assembly 38 relative to the support frame 12 and (ii) to the assembly movers 262, 264, 266 to move and position the optical assembly 36 relative to the base assembly 38 and the support frame 12. Additionally, the control system 28 controls (i) pressure to the base flexible supports 160 to control attenuating and the position of the base assembly 38 relative to the support frame 12 and (ii) pressure to the assembly flexible supports 260 to control attenuating and the position of the optical assembly 36 relative to the base assembly 38.

Stated another way, information from the base position sensors 216 and the base acceleration sensors 218 is directed to the control system 28. With this information, the control system 28 can direct current to the base movers 162, 164, 166 and pressure to the base flexible supports 160 to adjust and control the position of the base assembly 38 relative to the support frame 12 with six degrees of freedom. Similarly, information from the assembly position sensors 220 and the assembly acceleration sensors 222 is directed to the control system 28. With this information, the control system 28 can direct current to the assembly movers 262, 264, 266 and pressure to the assembly flexible supports 260 to adjust and control the position of the optical assembly 36 relative to the base assembly 38 with six degrees of freedom. With this design, the control system 28 is able to center, elevate and isolate the base assembly 38 and the optical assembly 36 relative to the mounting base 30.

There are a number of different types of lithographic devices. For example, the exposure apparatus 10 can be used as scanning type photolithography system that exposes the pattern from the reticle onto the wafer with the reticle and wafer moving synchronously. In a scanning type lithographic device, the reticle is moved perpendicular to an optical axis of the optical device 22 by the first stage assembly 16 and the wafer is moved perpendicular to an optical axis of the optical device 22 by the second stage assembly 18. Scanning of the reticle and the wafer occurs while the reticle and the wafer are moving synchronously.

Alternately, the exposure apparatus 10 can be a step-and-repeat type photolithography system that exposes the reticle while the reticle and the wafer are stationary. In the step and repeat process, the wafer is in a constant position relative to the reticle and the optical device 22 during the exposure of an individual field. Subsequently, between consecutive exposure steps, the wafer is consecutively moved by the second stage perpendicular to the optical axis of the optical device 22 so that the next field of the wafer is brought into position relative to the optical device 22 and the reticle for exposure. Following this process, the images on the reticle are sequentially exposed onto the fields of the wafer so that the next field of the wafer is brought into position relative to the optical device 22 and the reticle.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of an optical device. Additionally, the present invention provided herein can be used in other devices, including other semiconductor processing equipment and inspection machines.

The illumination system 26 includes an illumination source 296 (illustrated in FIG. 1) and an illumination optical device 298 (illustrated in FIG. 1). The illumination source 296 emits a beam (irradiation) of light energy. The illumination optical device 298 guides the beam of light energy from the illumination source 296 to above the reticle 32. The beam illuminates selectively different portions of the reticle and exposes the wafer.

The illumination source 296 can be g-line (436 nm), i-line (365 nm), KrF excimer laser (248 nm), ArF excimer laser (193 nm), and $F_2$ laser (157 nm). Alternately, the illumination source 296 can also use charged particle beams such as an x-ray and electron beam. For instance, in the case where an electron beam is used, thermionic emission type lanthanum hexaboride ($LaB_6$) or tantalum (Ta) can be used as an electron gun. Furthermore, in the case where an electron beam is used, the structure could be such that either a mask is used or a pattern can be directly formed on a substrate without the use of a mask.

The illumination optical device 298 can be mounted to the optical assembly 36. Alternately, as illustrated in FIG. 1, the illumination optical device 298 can be mounted to the mounting base 30 and can cantilever above the reticle 32 and the first stage assembly 16. Preferably, in this design, the illumination system 26 includes an illumination connector 299 that allows the illumination optical devise 298 to be rotated relative to the illumination source 296 and the optical assembly 36. In this configuration, the illumination optical device 298 can be lifted and rotated away from above the optical device 22. This feature allows access to easily remove some or all of the first stage assembly 16, the optical assembly 36 and the optical device 22.

With respect to the optical device 22, when far ultra-violet rays such as the excimer laser is used, glass materials such as quartz and fluorite that transmit far ultra-violet rays is preferable to be used. When the $F_2$ type laser or x-ray is used, the optical device 22 should preferably be either catadioptric or refractive (a reticle should also preferably be a reflective type), and when an electron beam is used, electron optics should preferably consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japan Patent Application Disclosure No.10-20195 and its counterpart U.S. Pat. No. 5,835,275. In these cases, the reflecting optical device can be a catadioptric optical system incorporating a beam splitter and concave mirror. Japan Patent Application Disclosure No. 8-334695 published in the Official Gazette for Laid-Open Patent Applications and its counterpart U.S. Pat. No. 5,689,377, as well as Japan Patent Application Disclosure No. 10-3039 and its counterpart U.S. patent application Ser. No. 873,605 (Application Date: Jun. 12, 1997), also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications, are incorporated herein by reference.

Further, in photolithography systems, when linear motors (see U.S. Pat. No. 5,623,853 and/or U.S. Pat. No. 5,528,118) are used in a wafer stage (the first stage assembly 16 in the embodiment illustrated in the Figures) or a mask stage (the second stage assembly 18 in the embodiment illustrated in the Figures), the linear motors can be either an air levitation type employing air bearings or a magnetic levitation type using Lorentz force or reactance force. Additionally, the stage could move along a guide, or it could be a guideless type stage which uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either one of the magnet unit or the armature coil unit is connected to the stage, and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections, and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 16:
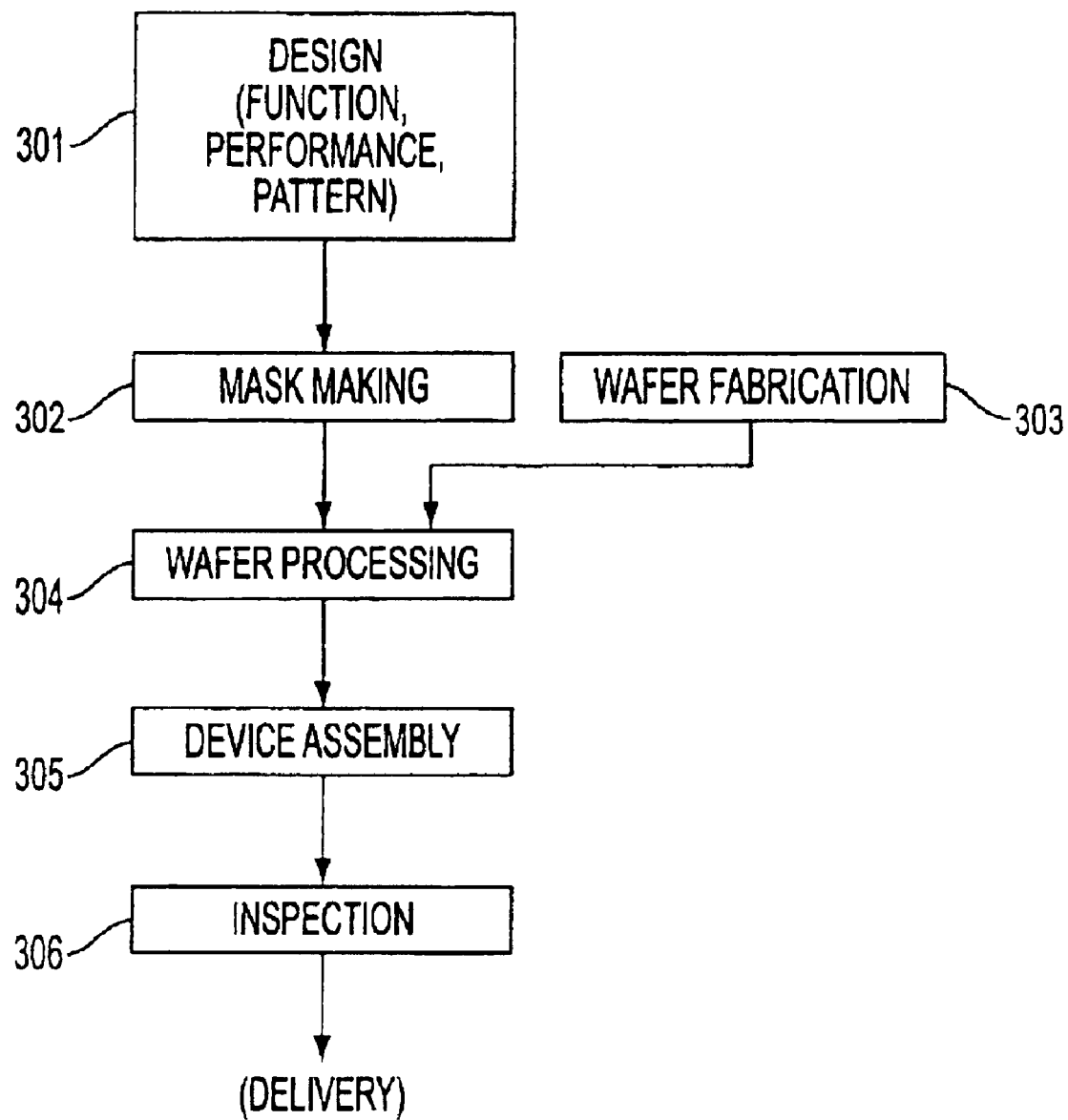
FIG. 16 is a flow chart that outlines a process for manufacturing a device in accordance with the present invention.

Further, semiconductor devices can be fabricated using the above described systems, by the process shown generally in FIG. 16. In step 301 the device's function and performance characteristics are designed. Next, in step 302, a mask (reticle) having a pattern is designed according to the previous designing step, and in a parallel step 303 a wafer is made from a silicon material. The mask pattern designed in step 302 is exposed onto the wafer from step 303 in step 304 by a photolithography system described hereinabove in accordance with the present invention. In step 305 the semiconductor device is assembled (including the dicing process, bonding process, and packaging process), then finally the device is inspected in step 306.

Figure 17:
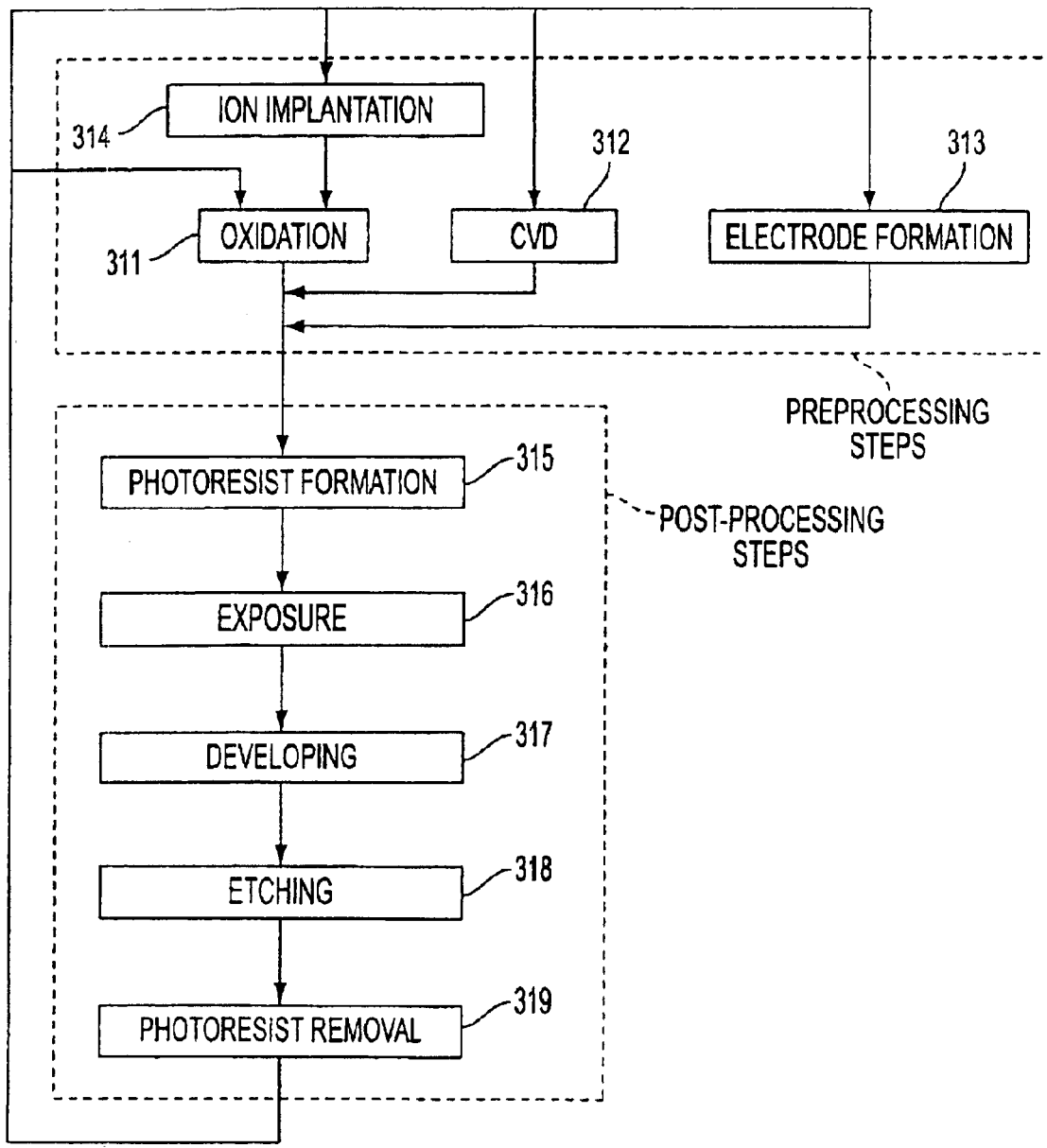
FIG. 17 is a flow chart that outlines device processing in more detail.

FIG. 17 illustrates a detailed flowchart example of the above-mentioned step 304 in the case of fabricating semiconductor devices. In FIG. 17, in step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 315 (photoresist formation step), photoresist is applied to a wafer. Next, in step 316 (exposure step), the above-mentioned exposure device is used to transfer the circuit pattern of a mask (reticle) to a wafer. Then, in step 317 (developing step), the exposed wafer is developed. In step 318 (etching step), parts other than residual photoresist (exposed material surface) are removed by etching. In step 319 (photoresist removal step), unnecessary photoresist remaining after etching is removed.

Multiple circuit patterns are formed by repetition of these preprocessing and post-processing steps.

While the particular exposure apparatus 10 as shown and disclosed herein are fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. An exposure apparatus that transfers an image set movably by a stage assembly onto a device utilizing a beam of light, the exposure apparatus being adapted to be mounted to a mounting base, the exposure apparatus comprising:
    a base assembly that includes at least a portion of the stage assembly;
    a base isolation system that secures the base assembly to the mounting base, the base isolation system reducing the effect of vibration of the mounting base causing vibration on the base assembly;
    an optical assembly that includes an optical device that directs the beam of light and a stage base of the stage assembly; and
    an optical isolation system that secures the optical assembly to the base assembly, the optical isolation system reducing the effect of vibration of the base assembly causing vibration on at least one of the optical assembly and the optical device.

2. The exposure apparatus of claim 1 wherein the base isolation system includes a plurality of spaced apart base flexible supports that attenuates movement of the base assembly relative to the mounting base.

3. The exposure apparatus of claim 1 wherein the base isolation system includes a plurality of spaced apart base movers that adjusts the position of the base assembly relative to the mounting base.

4. The exposure apparatus of claim 1 wherein the optical isolation system includes a plurality of spaced apart assembly flexible supports that attenuates movement of the optical assembly relative to the base assembly.

5. The exposure apparatus of claim 1 wherein the optical isolation system includes a plurality of spaced apart assembly movers that adjusts the position of the optical assembly.

6. The exposure apparatus of claim 1 wherein (i) the base isolation system includes a plurality of spaced apart base flexible supports that attenuates movement of the base assembly relative to the mounting base and a plurality of spaced apart base, movers that adjusts the position of the base assembly relative to the mounting base and (ii) the optical isolation system includes a plurality of spaced apart assembly flexible supports that attenuates movement of the optical assembly relative to the base assembly and a plurality of spaced apart assembly movers that adjusts the position of the optical assembly relative to the base assembly.

7. The exposure apparatus of claim 1 wherein the base assembly includes a base frame that supports a portion of the stage assembly.

8. The exposure apparatus of claim 7 wherein the base assembly also includes a portion of a second stage assembly that is at least partly supported by the base frame.

9. The exposure apparatus of claim 8 wherein the base assembly further comprises a first enclosure that substantially encircles the stage assembly.

10. The exposure apparatus of claim 9 wherein the base assembly further comprises a second enclosure that substantially encircles the second stage assembly.

11. The exposure apparatus of claim 7 wherein the base frame defines a frame aperture and wherein a portion of the optical assembly extends into the frame aperture.

12. The exposure apparatus of claim 11 wherein the optical assembly includes an optical frame that fits within the frame aperture of the base frame, the optical frame being secured to the optical device.

13. The exposure apparatus of claim 1 further comprising a support frame that extends between the mounting base and the base isolation system to support the base assembly away from the mounting base.

14. The exposure apparatus of claim 13 wherein the optical isolation system includes an assembly mover that adjusts the position of the optical assembly relative to the base assembly, the assembly mover including a first component that is secured to the support frame and a second component that is secured to the optical assembly.

15. The exposure apparatus of claim 13 including a base position sensor that monitors the position of the base assembly relative to the support frame.

16. The exposure apparatus of claim 13 including a base acceleration sensor for measuring the absolute acceleration of the base assembly.

17. The exposure apparatus of claim 1 wherein the optical assembly includes an optical frame that is secured to the optical device.

18. The exposure apparatus of claim 17 wherein at least a portion of a measurement system is secured to the optical assembly.

19. The exposure apparatus of claim 1 wherein the stage base is secured to the optical assembly.

20. A device manufactured with the exposure apparatus according to claim 1.

21. A wafer on which an image has been formed by the exposure apparatus of claim 1.

22. The exposure apparatus of claim 1 wherein the base isolation system and the optical isolation system are at approximately the same height along the Z axis.

23. A method for making an exposure apparatus that transfers an image set movably by a stage assembly onto a device utilizing a beam of light, the exposure apparatus being adapted to be mounted to a mounting base, the method comprising the steps of:

provided a base assembly that includes at least a portion of the stage assembly;

providing a base isolation system;

securing the base assembly to the mounting base with the base isolation system, the base isolation system reducing the effect of vibration of the mounting base causing vibration on the base assembly;

providing an optical assembly that includes an optical device that directs the beam of light and a stage base of the stage assembly;

providing an optical isolation system; and securing the optical assembly to the base assembly with the optical isolation system, the optical isolation system reducing the effect of vibration of the base assembly causing vibration on at least one of the optical assembly and the optical device.

24. The method of claim 23 wherein the step of providing a base isolation system includes providing a plurality of spaced apart base flexible supports for attenuating movement of the base assembly relative to the mounting base.

25. The method of claim 23 wherein the step of providing a base isolation system includes providing a plurality of spaced apart base movers for adjusting the position of the base assembly relative to the mounting base.

26. The method of claim 23 wherein the step of providing an optical isolation system includes providing a plurality of spaced apart assembly flexible supports for attenuating movement of the optical assembly relative to the base assembly.

27. The method of claim 23 wherein the step of providing an optical isolation system includes providing a plurality of spaced apart assembly movers for adjusting the position of the optical assembly relative to the base assembly.

28. The method of claim 23 wherein (i) the step of providing a base isolation system includes providing a plurality of spaced apart base flexible supports for attenuating movement of the base assembly relative to the mounting base and a plurality of spaced apart base movers for adjusting the position of the base assembly relative to the mounting base and (ii) the step of providing an optical isolation system includes providing a plurality of spaced apart assembly flexible supports for attenuating movement of the optical assembly relative to the base assembly and a plurality of spaced apart assembly movers for adjusting the position of the optical assembly relative to the base assembly.

29. The method of claim 23 wherein the step of providing a base assembly includes providing a base frame that supports a portion of the stage assembly.

30. The method of claim 29 wherein the step of providing a base assembly includes providing a portion of a second stage assembly that is at least partly supported by the base frame.

31. The method of claim 30 wherein the step of providing a base assembly includes providing a first enclosure that substantially encircles the stage assembly.

32. The method of claim 31 wherein the step of providing a base assembly further includes providing a second enclosure that substantially encircles the second stage assembly.

33. The method of claim 29 wherein the step of providing a base frame includes providing a base frame having a frame aperture and wherein a portion of the optical assembly extends into the frame aperture.

34. The method of claim 33 wherein the step of providing an optical assembly includes providing an optical frame that fits with the frame aperture of the base frame, the optical frame being secured to the optical device.

35. The method of claim 23 further comprising the step of providing a support frame that extends between the mounting base and the base isolation system to support the base assembly above the mounting base.

36. The method of claim 35 wherein the step of providing an optical isolation system includes providing an assembly mover for adjusting the position of the optical assembly relative to the base assembly, the assembly mover including a first component that is secured to the support frame and a second component that is secured to the optical assembly.

37. The method of claim 35 including the step of providing a base position sensor for monitoring the position of the base assembly relative to the support frame.

38. The method of claim 35 including a base acceleration sensor for measuring the absolute acceleration of the base assembly.

39. The method of claim 24 wherein the step of providing an optical assembly includes providing an optical frame that is secured to the optical device.

40. The method of claim 39 including the step of providing a measurement system that is at least partly secured to the optical assembly.

41. The method of claim 23 including the step of securing the stage base of the stage assembly to the optical assembly.

42. The method of claim 23 wherein (i) the step of providing a base isolation system includes providing a plurality of spaced apart base flexible supports for attenuating movement of the base assembly relative to the mounting base and adjusting the position of the base assembly relative to the mounting base and (ii) the step of providing an optical isolation system includes providing a plurality of spaced apart assembly flexible supports for attenuating movement of the optical assembly relative to the base assembly and adjusting the position of the optical assembly relative to the base assembly.

43. A method of making a wafer utilizing the exposure apparatus made by the method of claim 23.

44. A method of making a device including at least an exposure process, wherein the exposure process utilizes the exposure apparatus made by the method of claim 23.

45. An exposure apparatus that transfers an image set movably by a stage assembly onto a device utilizing a beam of light, the exposure apparatus being adapted to be mounted to a mounting base, the exposure apparatus comprising:

a base assembly that includes at least a portion of the stage assembly;

an optical assembly that includes an optical frame, an optical device and a sensor column, the optical device directs the beam of light, the optical frame including a center frame, the sensor column including a first sensor mount that secures the sensor column to the optical frame; and an optical isolation system that secures the optical assembly to the base assembly, the optical isolation system including a first support that is secured to the center frame, the optical isolation system reducing the effect of vibration of the base assembly causing vibration on at least one of the optical assembly and the optical device; wherein the first support and the first sensor mount are substantially aligned along a first Z axis.

46. The exposure apparatus of claim 45 further comprising a base isolation system that secures the base assembly to the mounting base, the base isolation system reducing the effect of vibration of the mounting base causing vibration on the base assembly.

47. The exposure apparatus of claim 46 wherein the base isolation system and the optical isolation system are at approximately the same height along a Z axis.

48. The exposure apparatus of claim 45 wherein the optical frame includes a first upper base mount that supports a stage base, wherein a proximal section of the first upper base mount and the first support are substantially aligned along the first Z axis.

49. The exposure apparatus of claim 45 wherein the optical isolation system includes a first assembly mover that adjusts the position of the optical assembly relative to the base assembly, the first assembly mover being substantially positioned along the first Z axis.

50. The exposure apparatus of claim 45 wherein the sensor column includes a second sensor mount that secures the sensor column to the optical frame, and the optical isolation system includes a second support, wherein the second sensor mount and the second support are positioned substantially along a second Z axis.

51. The exposure apparatus of claim 50 wherein the sensor column includes a third sensor mount that secures the sensor column to the optical frame and the optical isolation system includes a third support, wherein the third sensor mount and the third support being substantially positioned along a third Z axis.

52. An exposure apparatus that transfers an image set movably by a stage assembly onto a device utilizing a beam of light, the exposure apparatus being adapted to be mounted to a mounting base, the exposure apparatus comprising:
    a base assembly that includes at least a portion of the stage assembly;
    a base isolation system that secures the base assembly to the mounting base, the base isolation system reducing the effect of vibration of the mounting base causing vibration on the base assembly;
    an optical assembly that includes an optical frame, an optical device and a stage base, the optical device directs the beam of light and the stage base supports a portion of the stage assembly, the optical frame including a center frame and a first upper base mount that supports the stage base; and
    an optical isolation system that secures the optical assembly to the base assembly, the optical isolation system including a first support that is secured to the center frame, the optical isolation system reducing the effect of vibration of the base assembly causing vibration on at least one of the optical assembly and the optical device, wherein the first support and a proximal section of the first upper base mount are substantially aligned along a first Z axis.

53. The exposure apparatus of claim 52 wherein the base isolation system and the optical isolation system are at approximately the same height along a Z axis.

54. The exposure apparatus of claim 52 wherein the optical frame includes a second upper base mount that supports the stage base, wherein the optical isolation system includes a second support that is secured to the center frame, and wherein a proximal section of the second upper base mount and the second support are substantially aligned along a second Z axis.

55. The exposure apparatus of claim 54 wherein the optical frame includes a third upper base mount that supports the stage base, wherein the optical isolation system includes a third support that is secured to the center frame, and wherein a proximal section of the third upper base mount and the third support are substantially aligned along a third Z axis.

56. The exposure apparatus of claim 52 wherein the optical isolation system includes a first assembly mover that adjusts the position of the optical assembly relative to the base assembly, the first assembly mover being substantially positioned along the first Z axis.

57. The exposure apparatus of claim 52 wherein the optical assembly further comprises a sensor column including a first sensor mount that secures the sensor column to the optical frame, the first sensor mount being substantially positioned along the first Z axis.

58. The exposure apparatus of claim 57 wherein the sensor column includes a second sensor mount that secures the sensor column to the optical frame, and the optical isolation system includes a second support, wherein the second sensor mount and the second support are positioned substantially along a second Z axis.

59. The exposure apparatus of claim 58 wherein the sensor column includes a third sensor mount that secures the sensor column to the optical frame, and the optical isolation system includes a third support, wherein the third sensor mount and the third support are positioned substantially along a third Z axis.

60. The exposure apparatus of claim 52 wherein the base assembly further includes a base frame and a portion of a second stage assembly, wherein the stage assembly and the second stage assembly are at least partly supported by the base frame.

61. The exposure apparatus of claim 60 wherein the base assembly further includes a first enclosure that substantially encircles the stage assembly and a second enclosure that substantially encircles the second stage assembly.

62. The exposure apparatus of claim 52 wherein the base assembly defines a frame aperture and wherein a portion of the optical assembly extends into the frame aperture.

63. A device manufactured with the exposure apparatus according to claim 52.

64. A wafer on which an image has been formed by the exposure apparatus of claim 52.

65. An exposure apparatus that transfers an image set movably by a stage assembly onto a device utilizing a beam of light, the exposure apparatus being adapted to be mounted to a mounting base, the exposure apparatus comprising:
    a base assembly that includes at least a portion of the stage assembly;
    an optical assembly that includes an optical frame, an optical device and a stage base, the optical device directs the beam of light and the stage base supports a portion of the stage assembly, the optical frame including a center frame, a first upper base mount that supports the stage base, a second upper base mount that supports the stage base, and a third upper base mount that supports the stage base; and
    an optical isolation system that secures the optical assembly to the base assembly, the optical isolation system including a first support that is secured to the center frame, a second support that is secured to the center frame and a third support that is secured to the center frame, the optical isolation system reducing the effect of vibration of the base assembly causing vibration on at least one of the optical assembly and the optical device, wherein the first support and a proximal section of the first upper base mount are substantially aligned along a first Z axis, wherein the second support and a proximal section of the second upper base mount are substantially aligned along a second Z axis, and wherein the third support and a proximal section of the third upper base mount are substantially aligned along a third Z axis.

66. The exposure apparatus of claim 65 further comprising a base isolation system that secures the base assembly to the mounting base, the base isolation system reducing the effect of vibration of the mounting base causing vibration on the base assembly.

67. The exposure apparatus of claim 65 wherein the optical isolation system includes a first assembly mover that adjusts the position of the optical assembly relative to the base assembly, the first assembly mover being substantially positioned along the first Z axis.

68. The exposure apparatus of claim 65 wherein the optical assembly further comprises a sensor column including a first sensor mount that secures the sensor column to the optical frame, a second sensor mount that secures the sensor column to the optical frame and a third sensor mount that secures the sensor column to the optical frame, the first sensor mount being substantially positioned along the first Z axis, the second sensor mount being substantially positioned along the second Z axis, and the third sensor mount being substantially positioned along the third Z axis.

69. The exposure apparatus of claim 65 wherein the base assembly further includes a base frame and a portion of a second stage assembly, wherein the stage assembly and the second stage assembly are at least partly supported by the base frame.

70. The exposure apparatus of claim 69 wherein the base assembly further includes a first enclosure that substantially encircles the stage assembly and a second enclosure that substantially encircles the second stage assembly.

71. The exposure apparatus of claim 65 wherein the base assembly defines a frame aperture and wherein a portion of the optical assembly extends into the frame aperture.

72. A device manufactured with the exposure apparatus according to claim 65.

73. A wafer on which an image has been formed by the exposure apparatus of claim 65.

74. An exposure apparatus that transfers an image set movably by a stage assembly onto a device utilizing a beam of light, the exposure apparatus being adapted to be mounted to a mounting base, the exposure apparatus comprising:

a base assembly that includes at least a portion of the stage assembly;

an optical assembly that includes an optical frame, an optical device, a stage base and a sensor column, the optical device directs the beam of light and the stage base supports a portion of the stage assembly, the optical frame including a center frame and a first upper base mount that supports the stage base, the sensor column including a first sensor mount that secures the sensor column to the optical frame; and an optical isolation system that secures the optical assembly to the base assembly, the optical isolation system including a first support that is secured to the center frame, the optical isolation system reducing the effect of vibration of the base assembly causing vibration on at least one of the optical assembly and the optical device, wherein the first support, a proximal section of the first upper base mount and the first sensor mount are substantially aligned along a first Z axis.

75. The exposure apparatus of claim 74 further comprising a base isolation system that secures the base assembly to the mounting base, the base isolation system reducing the effect of vibration of the mounting base causing vibration on the base assembly, the base isolation system and the optical isolation system being at approximately the same height along a Z axis.

76. The exposure apparatus of claim 74 wherein the optical frame includes a second upper base mount that supports the stage base, wherein the optical isolation system includes a second support that is secured to the center frame, and wherein a proximal section of the second upper base mount and the second support are substantially aligned along a second Z axis.

77. The exposure apparatus of claim 76 wherein the optical frame includes a third upper base mount that supports the stage base, wherein the optical isolation system includes a third support that is secured to the center frame, and wherein a proximal section of the third upper base mount and the third support are substantially aligned along a third Z axis.

78. The exposure apparatus of claim 74 wherein the optical isolation system includes a first assembly mover that adjusts the position of the optical assembly relative to the base assembly, the first assembly mover being substantially positioned along the first Z axis.

79. The exposure apparatus of claim 74 wherein the sensor column includes a second sensor mount that secures the sensor column to the optical frame, and the optical isolation system includes a second support, wherein the second sensor mount and the second support are positioned substantially along a second Z axis.

80. The exposure apparatus of claim 79 wherein the sensor column includes a third sensor mount that secures the sensor column to the optical frame, and the optical isolation system includes a third support, wherein the third sensor mount and the third support are positioned substantially along a third Z axis.

81. The exposure apparatus of claim 74 wherein the base assembly further includes a base frame and a portion of a second stage assembly, wherein the stage assembly and the second stage assembly are at least partly supported by the base frame.

82. The exposure apparatus of claim 81 wherein the base assembly further includes a first enclosure that substantially encircles the stage assembly and a second enclosure that substantially encircles the second stage assembly.

83. The exposure apparatus of claim 74 wherein the base assembly defines a frame aperture and wherein a portion of the optical assembly extends into the frame aperture.

84. A device manufactured with the exposure apparatus according to claim 74.

85. A wafer on which an image has been formed by the exposure apparatus of claim 74.

86. An exposure apparatus that transfers an image set movably by a stage assembly onto a device utilizing a beam of light, the exposure apparatus being adapted to be mounted to a mounting base, the exposure apparatus comprising:

an optical assembly that includes an optical frame, an optical device and a stage base, the optical device directs the beam of light and the stage base supports a portion of the stage assembly, the optical frame including a center frame and a first upper base mount that supports the stage base;

a base assembly that includes a base frame and at least a portion of the stage assembly, the base frame defining a frame aperture that is sized and shaped to receive a portion of the optical assembly; and an optical isolation system that secures the optical assembly to the base assembly, the optical isolation system including a first support that is secured to the center frame, the optical isolation system reducing the effect of vibration of the base assembly causing vibration on at least one of the optical assembly and the optical device, wherein the first support and a proximal section of the first upper base mount are substantially aligned along a first Z axis.

87. The exposure apparatus of claim 86 wherein the optical frame fits within the frame aperture of the base frame, and wherein the optical frame is secured to the optical device.

88. The exposure apparatus of claim 86 further comprising a base isolation system that secures the base assembly to the mounting base, the base isolation system reducing the effect of vibration of the mounting base causing vibration on the base assembly, the base isolation system and the optical isolation system being at approximately the same height along a Z axis.

89. The exposure apparatus of claim 86 wherein the optical frame includes a second upper base mount that supports the stage base, wherein the optical isolation system includes a second support that is secured to the center frame, and wherein a proximal section of the second upper base mount and the second support are substantially aligned along a second Z axis.

90. The exposure apparatus of claim 89 wherein the optical frame includes a third upper base mount that supports the stage base, wherein the optical isolation system includes a third support that is secured to the center frame, and wherein a proximal section of the third upper base mount and the third support are substantially aligned along a third Z axis.

91. The exposure apparatus of claim 86 wherein the optical isolation system includes a first assembly mover that adjusts the position of the optical assembly relative to the base assembly, the first assembly mover being substantially positioned along the first Z axis.

92. The exposure apparatus of claim 86 wherein the optical assembly further comprises a sensor column including a first sensor mount that secures the sensor column to the optical frame, the first sensor mount being substantially positioned along the first Z axis.

93. The exposure apparatus of claim 92 wherein the sensor column includes a second sensor mount that secures the sensor column to the optical frame, and the optical isolation system includes a second support, wherein the second sensor mount and the second support are positioned substantially along a second Z axis.

94. The exposure apparatus of claim 93 wherein the sensor column includes a third sensor mount that secures the sensor column to the optical frame, and the optical isolation system includes a third support, wherein the third sensor mount and the third support are positioned substantially along a third Z axis.

95. The exposure apparatus of claim 86 wherein the base assembly further includes a base frame and a portion of a second stage assembly, wherein the stage assembly and the second stage assembly are at least partly supported by the base frame.

96. The exposure apparatus of claim 95 wherein the base assembly further includes a first enclosure that substantially encircles the stage assembly and a second enclosure that substantially encircles the second stage assembly.

97. A device manufactured with the exposure apparatus according to claim 86.

98. A wafer on which an image has been formed by the exposure apparatus of claim 86.

99. An exposure apparatus that transfers an image onto a substrate by utilizing an optical device, the exposure apparatus being adapted to be mounted to a mounting base, the exposure apparatus comprising:
   a stage that holds a reticle, the stage being movable relative to the optical device;
   a stage base that supports the stage;
   a base assembly;
   a first isolation system that secures the stage base to the base assembly, the first isolation system including a plurality of first flexible supports that attenuates movement of the stage base relative to the base assembly thereby reducing the effect of vibration of the base assembly causing vibration on the stage base; and
   a second isolation system that secures the base assembly to the mounting base, the second isolation system reducing the effect of vibration of the mounting base causing vibration on the base assembly.

100. The exposure apparatus of claim 99 wherein the first isolation system further includes a first passive component that reduces the effect of vibration of the base assembly causing vibration on the stage base passively; and wherein the second isolation system further includes a second passive component that reduces the effect of vibration of the mounting base causing vibration on the base assembly passively.

101. The exposure apparatus of claim 99 further comprising a measurement system that monitors the position of the stage relative to the optical device, the measurement system being adapted to be supported to the mounting base via the first isolation system and the second isolation system.

102. The exposure apparatus of claim 99 wherein the first isolation system secures the optical device to the base assembly.

103. The exposure apparatus of claim 99 wherein the first isolation system and the second isolation system are at approximately the same height along a Z axis.

104. The exposure apparatus of claim 99 wherein the first isolation system further includes a first active component for actively reducing the effect of vibration of the base assembly causing vibration on the stage base, and wherein the second isolation system further includes a second active component for actively reducing the effect of vibration of the mounting base causing vibration on the base assembly.

105. The exposure apparatus of claim 99 wherein the first isolation system further includes a plurality of first movers that adjusts the position of the stage base.

106. The exposure apparatus of claim 99 wherein the second isolation system includes a plurality of second flexible supports that attenuates movement of the base assembly relative to the mounting base and a plurality of second movers that adjusts the position of the base assembly relative to the mounting base.

107. An exposure apparatus that transfers an image onto a substrate by utilizing an optical means, the exposure apparatus being adapted to be mounted to a mounting base, the exposure apparatus comprising:
   movable means for holding a reticle, the movable means being movable relative to the optical means;
   stage base means for supporting the movable means;
   base assembly means for supporting the stage base means;
   first isolation means for securing the stage base means to the base assembly means, the first isolation means including a plurality of flexible support means for attenuating movement of the stage base means relative to the base assembly means thereby reducing the effect of vibration of the base assembly means causing vibration on the stage base means; and
   second isolation means for securing the base assembly means to the mounting base means, the second isolation means including a second passive component means for passively reducing the effect of vibration of the mounting base means causing vibration on the base assembly means.

108. The exposure apparatus of claim 107 wherein the first isolation means further includes a first active component means for actively reducing the effect of vibration of the base assembly means causing vibration on the stage base means, and wherein the second isolation means further includes a second active component means for actively reducing the effect of vibration of the mounting base means causing vibration on the base assembly means.

109. A device manufacturing method comprising the steps of:

providing an optical device;

providing a substrate stage that holds a substrate;

providing a reticle that holds a reticle, the reticle stage being movable relative to the optical device;

supporting the reticle stage with a stage base;

providing a base assembly;

providing a mounting base;

securing the stage base to the base assembly with a first isolation system, the first isolation system including a plurality of flexible supports that attenuates movement of the stage base relative to the base assembly thereby reducing the effect of vibration of the base assembly causing vibration on the stage base;

securing the base assembly to the mounting base with a second isolation system, the second isolation system including a second passive component for passively reducing the effect of vibration of the mounting base causing vibration on the base assembly;

producing a relative movement between the optical device and the reticle; and exposing the substrate that is held by the substrate stage, by the optical device.

110. The device manufacturing method of claim 109 wherein the first isolation system further includes a first active component for actively reducing the effect of vibration of the base assembly causing vibration on the stage base, and wherein the second isolation system further includes a second active component for actively reducing the effect of vibration of the mounting base causing vibration on the base assembly.

111. An exposure apparatus that transfers an image onto a substrate by utilizing an optical device, the exposure apparatus being adapted to be mounted to a mounting base, the exposure apparatus comprising:

a stage that holds a reticle, the stage being movable relative to the optical device;

a stage base that supports the stage;

a base assembly;

a first isolation system that secures the stage base and the optical device to the base assembly, the first isolation system reducing the effect of vibration of the base assembly causing vibration on the stage base; and a second isolation system that secures the base assembly to the mounting base, the second isolation system reducing the effect of vibration of the mounting base causing vibration on the base assembly.

112. An exposure apparatus that transfers an image onto a substrate by utilizing an optical device, the exposure apparatus being adapted to be mounted to a mounting base, the exposure apparatus comprising:

a stage that holds a reticle, the stage being movable relative to the optical device;

a stage base that supports the stage;

a base assembly;

a first isolation system that secures the stage base to the base assembly, the first isolation system reducing the effect of vibration of the base assembly causing vibration on the stage base; and a second isolation system that secures the base assembly to the mounting base, the second isolation system reducing the effect of vibration of the mounting base causing vibration on the base assembly, wherein the first isolation system and the second isolation system are at approximately the same height along a Z axis.

* * * * *